(12) United States Patent
Park et al.

(10) Patent No.: US 8,513,136 B2
(45) Date of Patent: Aug. 20, 2013

(54) MEMORY DEVICES AND METHOD OF MANUFACTURING THE SAME

(75) Inventors: Doo-hwan Park, Yongin-si (KR);
Gyu-hwan Oh, Hwaseong-si (KR);
Dong-whee Kwon, Yongin-si (KR);
Kyung-min Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/484,999

(22) Filed: May 31, 2012

(65) Prior Publication Data
US 2012/0305522 A1 Dec. 6, 2012

(30) Foreign Application Priority Data

May 31, 2011 (KR) .................. 10-2011-0051771
Sep. 19, 2011 (KR) .................. 10-2011-0094276

(51) Int. Cl.
*H01L 21/302* (2006.01)
*H01L 21/461* (2006.01)

(52) U.S. Cl.
USPC .................. 438/717; 216/11; 216/47

(58) Field of Classification Search
USPC ................. 216/11, 2, 22, 47; 438/717
See application file for complete search history.

(56) References Cited

U.S. PATENT DOCUMENTS

| | | |
|---|---|---|
| 2009/0127538 A1 | 5/2009 | Ryoo et al. |
| 2010/0032637 A1 | 2/2010 | Kinoshita et al. |
| 2010/0129995 A1 | 5/2010 | Im et al. |
| 2010/0213432 A1 | 8/2010 | Chuang et al. |

*Primary Examiner* — Roberts Culbert
(74) *Attorney, Agent, or Firm* — Harness, Dickey & Pierce, P.L.C.

(57) ABSTRACT

Memory devices and methods of forming memory devices including forming a plurality of preliminary electrodes, each of the plurality of preliminary electrodes including a protruding region, protruding from a first mold insulating layer, forming a second mold insulating layer on the first mold insulating layer, removing at least a portion of the plurality of preliminary electrodes to form a plurality of openings in the second mold insulating layer and a plurality of lower electrodes, and forming a plurality of memory elements in the plurality of openings. Memory devices and methods of forming memory devices including forming one or more insulating layers on sidewalls of all or part of a plurality of lower electrodes and/or a plurality of memory elements.

32 Claims, 34 Drawing Sheets

MEMORY DEVICES AND METHOD OF MANUFACTURING THE SAME

CROSS-REFERENCE TO RELATED APPLICATIONS

This application claims the benefit of Korean Patent Application No. 10-2011-0051771, filed on May 31, 2011 and No. 10-2011-94276, filed on Sep. 19, 2011 in the Korean Intellectual Property Office, the disclosure of both of which are incorporated herein in their entirety by reference.

BACKGROUND

Inventive concepts relate to a memory device, for example, a phase change memory device, and, to a method of manufacturing a memory device, for example, a phase change memory device whereby a more highly-integrated phase-change material layer may be realized.

Phase change memory devices are example devices that store data by changing a state of a phase-change material by applying a current to a phase-change material layer. In order to more highly integrate phase change memory devices, a lower electrode and the phase-change material layer are to be more highly integrated.

SUMMARY

According to example embodiments of inventive concepts, there is provided a method of forming a memory device, comprising forming a plurality of preliminary electrodes, each of the plurality of preliminary electrodes including a protruding region, protruding from a first mold insulating layer; forming a second mold insulating layer on the first mold insulating layer; removing at least a portion of the plurality of preliminary electrodes to form a plurality of openings in the second mold insulating layer and a plurality of lower electrodes; and forming a plurality of memory elements in the plurality of openings.

In example embodiments of inventive concepts, the memory elements are variable resistance memory elements.

In example embodiments of the inventive concepts, the memory elements are phase change memory elements.

In embodiments of the inventive concepts, wherein the plurality of preliminary electrodes are made of at least one selected from the group consisting of titanium (Ti), tantalum (Ta), molybdenum (Mo), hafnium (Hf), zirconium (Zr), chrome (Cr), tungsten (W), niobium (Nb), and vanadium (V).

In example embodiments of the inventive concepts, the plurality of preliminary electrodes 151 are made of a combination of at least one selected from the group consisting of titanium (Ti), tantalum (Ta), molybdenum (Mo), hafnium (Hf), zirconium (Zr), chrome (Cr), tungsten (W), niobium (Nb), and vanadium (V) and at least one selected from the group consisting of nitrogen (N), carbon (C), aluminum (Al), boron (B), phosphor (P), oxygen (O), and silicon (Si).

In example embodiments of the inventive concepts, the plurality of preliminary electrodes are made of at least one selected from the group consisting of TiN, TiW, TiCN, TiAlN, TiSiC, TiSiN, TaN, TaW, TaCN, TaAlN, TaSiC, TaSiN, MoN, MoW, MoCN, MoAlN, MoSiC, and MoSiN.

In example embodiments of the inventive concepts, the method further comprises treating each of the plurality of protruding regions to form a plurality of sacrificial regions and the plurality of lower electrodes.

In example embodiments of the inventive concepts, the treating includes at least one of oxidation or nitridation.

In example embodiments of the inventive concepts, an entirety of the plurality of sacrificial regions are removed.

In some embodiments of the inventive concept, the method further comprises forming a plurality of thin films on the plurality of protruding regions.

In example embodiments of the inventive concepts, the method further comprises isotropically etching the plurality of sacrificial regions; removing the plurality of isotropically etched sacrificial regions to form the plurality of openings.

In example embodiments of the inventive concepts, the method further comprises forming a plurality of thin films on the plurality of isotropically etched sacrificial regions.

In example embodiments of the inventive concepts, the plurality of thin films are formed on an entirety of sidewalls of the plurality of sacrificial regions and a portion of sidewalls of the plurality of lower electrodes.

In example embodiments of the inventive concepts, the plurality of thin films are formed on a portion of sidewalls of the plurality of sacrificial regions.

In example embodiments of the inventive concepts, the plurality of thin films are formed on an entirety of sidewalls of the plurality of sacrificial regions and the plurality of lower electrodes.

In example embodiments of the inventive concepts, the method further comprises forming a plurality of thin films on the plurality of sacrificial regions.

In example embodiments of the inventive concepts, the plurality of thin films are formed on an entirety of sidewalls of the plurality of sacrificial regions and a portion of sidewalls of the plurality of lower electrodes.

In example embodiments of the inventive concepts, the plurality of thin films are formed on a portion of sidewalls of the plurality of sacrificial regions.

In example embodiments of the inventive concepts, the plurality of thin films are formed on an entirety of sidewalls of the plurality of sacrificial regions and the plurality of lower electrodes.

In example embodiments of the inventive concepts, a width of the plurality of memory elements is less than a width of the plurality of lower electrodes.

In example embodiments of the inventive concepts, a width of the plurality of memory elements is greater than a width of the plurality of lower electrodes.

In example embodiments of the inventive concepts, a width of the plurality of memory elements is equal to a width of the plurality of lower electrodes.

In example embodiments of the inventive concepts, a lowermost portion of the plurality of sacrificial regions is partially removed.

In example embodiments of the inventive concepts, the method further comprises forming a plurality of thin films on the plurality of sacrificial regions.

In example embodiments of the inventive concepts, the plurality of thin films are formed on an entirety of sidewalls of the plurality of sacrificial regions and a portion of sidewalls of the plurality of lower electrodes.

In example embodiments of the inventive concepts, the method further comprises isotropically etching the plurality of sacrificial regions.

In example embodiments of the inventive concepts, the method further comprises forming the plurality of thin films on the plurality of isotropically etched sacrificial regions.

In example embodiments of the inventive concepts, the plurality of thin films are formed on an entirety of sidewalls of the plurality of sacrificial regions and a portion of sidewalls of the plurality of lower electrodes.

In example embodiments of the inventive concepts, the plurality of thin films are formed on a portion of sidewalls of the plurality of sacrificial regions.

In example embodiments of the inventive concepts, the plurality of thin films are formed on an entirety of sidewalls of the plurality of sacrificial regions and the plurality of lower electrodes.

In example embodiments of the inventive concepts, the plurality of thin films are formed on a portion of sidewalls of the plurality of sacrificial regions.

In example embodiments of the inventive concepts, the plurality of thin films are formed on an entirety of sidewalls of the plurality of sacrificial regions and the plurality of lower electrodes.

In example embodiments of the inventive concepts, the method further comprises forming the first mold insulating layer including the plurality of preliminary electrodes, each of the preliminary electrodes on a plurality of access devices, each of the adjacent access devices separated by a plurality of insulating regions, each of the plurality of insulating regions being on a corresponding device isolation region on a substrate; and removing a portion of the first mold insulating layer to expose a portion of each of the plurality of preliminary electrodes as the plurality of protruding regions.

In example embodiments of the inventive concepts, the method further comprises forming the second mold insulating layer on the first mold insulating layer to cover the plurality of protruding regions; and exposing an upper surface of each of the plurality of protruding regions.

In example embodiments of the inventive concepts, the method further comprises forming the first mold insulating layer including the plurality of preliminary electrodes, each of the preliminary electrodes on a plurality of access devices, each of the adjacent access devices separated by a plurality of insulating regions, each of the plurality of insulating regions being on a corresponding device isolation region on a substrate; and removing a portion of the first mold insulating layer to expose a portion of each of the plurality of preliminary electrodes as the plurality of protruding regions.

In example embodiments of the inventive concepts, the method further comprises forming the second mold insulating layer on the first mold insulating layer to cover the plurality of sacrificial regions; and exposing an upper surface of each of the plurality of sacrificial regions.

According to example embodiments of inventive concepts, there is provided a method of forming a memory device, comprising forming a plurality of preliminary electrodes, each of the plurality of preliminary electrodes including a protruding region, protruding from a first mold insulating layer; treating each of the plurality of protruding regions to form a plurality of sacrificial regions and a plurality of lower electrodes; forming a second mold insulating layer on the first mold insulating layer; removing at least a portion of the plurality of sacrificial regions to form a plurality of openings in the second mold insulating layer; and forming a plurality of memory elements in the plurality of openings.

In example embodiments of the inventive concepts, a lowermost portion of the plurality of sacrificial regions is partially removed.

In example embodiments of the inventive concepts, the method further comprises forming a plurality of thin films on the plurality of sacrificial regions.

In example embodiments of the inventive concepts, the method further comprises isotropically etching the plurality of sacrificial regions.

In example embodiments of the inventive concepts, the method further comprises forming the plurality of thin films on the plurality of isotropically etched sacrificial regions.

In example embodiments of the inventive concepts, the plurality of thin films are formed on a portion of sidewalls of the plurality of sacrificial regions.

In example embodiments of the inventive concepts, the plurality of thin films are formed on an entirety of sidewalls of the plurality of sacrificial regions and the plurality of lower electrodes.

In example embodiments of the inventive concepts, a central portion of the lowermost portion of the plurality of sacrificial regions is removed.

In example embodiments of the inventive concepts, a remaining portion of the plurality of sacrificial regions is between the plurality of lower electrodes and the plurality of memory elements.

In example embodiments of the inventive concepts, the remaining portion of the plurality of sacrificial regions reduces a contact area between the plurality of lower electrodes and the plurality of memory elements.

According to example embodiments of inventive concepts, there is provided a method of forming a memory device, comprising forming a plurality of preliminary electrodes, each of the plurality of preliminary electrodes including a protruding region, protruding from a first mold insulating layer; disposing a plurality of thin films on the plurality of protruding regions and the first mold insulating layer; disposing a second mold insulating layer on the plurality of thin films; removing a portion of the second mold insulating layer and the plurality of thin film to expose an upper surface of the plurality of preliminary electrodes; removing at least a portion of the plurality of preliminary electrodes to form a plurality of openings surrounded by the plurality of thin films; and forming a plurality of memory elements in the plurality of openings.

In example embodiments of the inventive concepts, the plurality of thin films are formed on a portion of sidewalls of the plurality of protruding regions.

In example embodiments of the inventive concepts, the plurality of thin films are formed on an entirety of sidewalls of the plurality of protruding regions and a portion of sidewalls of a plurality of contact plug.

In example embodiments of the inventive concepts, the plurality of thin films have a lower coefficient of heat transfer than the second mold insulating layer.

In example embodiments of the inventive concepts, the plurality of thin films include an insulating material.

In example embodiments of the inventive concepts, the plurality of thin films include a multi-layered structure.

In example embodiments of the inventive concepts, the plurality of thin films include silicon nitride, silicon oxynitride, silicon carbide, silicon oxide, aluminum oxide, aluminum nitride, hafnium oxide, zirconium oxide, titanium oxide, nickel oxide, and a combination thereof.

In example embodiments of the inventive concepts, the plurality of thin films reduce heat transfer from the phase-change material layer.

In example embodiments of the inventive concepts, the plurality of thin films have a top surface coplanar with a top surface of the phase change material layers.

According to example embodiments of inventive concepts, there is provided a memory device, comprising a first mold including a plurality of lower electrodes on a substrate; and a second mold on the first mold including a plurality of memory elements; wherein a height of the first mold above the substrate is substantially equal to a height of the plurality of lower electrodes above the substrate, and wherein a height of the second mold above the first mold is substantially equal to a height of the plurality of memory elements above the first mold.

In example embodiments of the inventive concepts, the first mold is a different mold than the second mold.

In example embodiments of the inventive concepts, the plurality of memory elements are a plurality of variable resistance memory elements.

In example embodiments of the inventive concepts, the plurality of memory elements are a plurality of phase change memory elements.

In example embodiments of the inventive concepts, a width of the plurality of memory elements is less than a width of the plurality of lower electrodes.

In example embodiments of the inventive concepts, a width of the plurality of memory elements is greater than a width of the plurality of lower electrodes.

In example embodiments of the inventive concepts, a width of the plurality of memory elements is equal to a width of the plurality of lower electrodes.

According to example embodiments of inventive concepts, there is provided a memory device, comprising a plurality of memory elements on a plurality of lower electrodes on a substrate; and a plurality of insulation layer structures between each of the plurality of memory elements on the plurality of lower electrodes; and a plurality of upper electrodes on plurality of memory elements and the plurality of insulation layer structures.

In example embodiments of the inventive concepts, the plurality of insulation layer structures are on an entirety of sidewalls of the plurality of memory elements and on a portion of the sidewalls of the plurality of lower electrodes.

In example embodiments of the inventive concepts, the plurality of insulation layer structures are on an entirety of sidewalls of the plurality of memory elements and on an entirety of the sidewalls of the plurality of lower electrodes.

In example embodiments of the inventive concepts, the further comprises a plurality of access devices on the substrate between the plurality of lower electrodes and the substrate; and a plurality of interlayer insulation layers between each of the plurality of access devices.

In example embodiments of the inventive concepts, sidewalls of the plurality of memory elements on a plurality of lower electrodes and the sidewalls of the plurality of access devices are not aligned.

In example embodiments of the inventive concepts, sidewalls of the plurality of memory elements on a plurality of lower electrodes and the sidewalls of the plurality of access devices are aligned.

In example embodiments of the inventive concepts, the plurality of memory elements are a plurality of variable resistance memory elements.

In example embodiments of the inventive concepts, the plurality of memory elements are a plurality of phase change memory elements.

In example embodiments of the inventive concepts, each of the plurality of insulation layer structures includes at least one thin film and a filling layer pattern sequentially stacked on sidewalls of the plurality of lower electrode layer and the plurality of memory elements.

In example embodiments of the inventive concepts, each of the plurality of insulation layer structures includes a plurality of thin films.

In example embodiments of the inventive concepts, each of the plurality of thin films includes silicon nitride, silicon oxynitride, silicon carbide, silicon oxide, aluminum oxide, aluminum nitride, hafnium oxide, zirconium oxide, titanium oxide, nickel oxide, and a combination thereof.

In example embodiments of the inventive concepts, each of the plurality of insulation layer structures includes an alternating and repeating stack of silicon nitride layers and silicon oxide layers.

In example embodiments of the inventive concepts, each of the plurality of insulation layer structures surrounds a corresponding one of the plurality of memory elements.

In example embodiments of the inventive concepts, each of the plurality of insulation layer structures has a top surface coplanar with that of the plurality of memory elements.

In example embodiments of the inventive concepts, each of the plurality of insulation layer structures reduces heat transfer between adjacent ones of the plurality of memory elements.

In example embodiments of the inventive concepts, the plurality of access devices are diodes, bipolar transistors, or MOS transistors.

BRIEF DESCRIPTION OF THE DRAWINGS

Exemplary embodiments of inventive concepts will be more clearly understood from the following detailed description taken in conjunction with the accompanying drawings in which.

DETAILED DESCRIPTION OF EXAMPLE EMBODIMENTS

Figure 1:
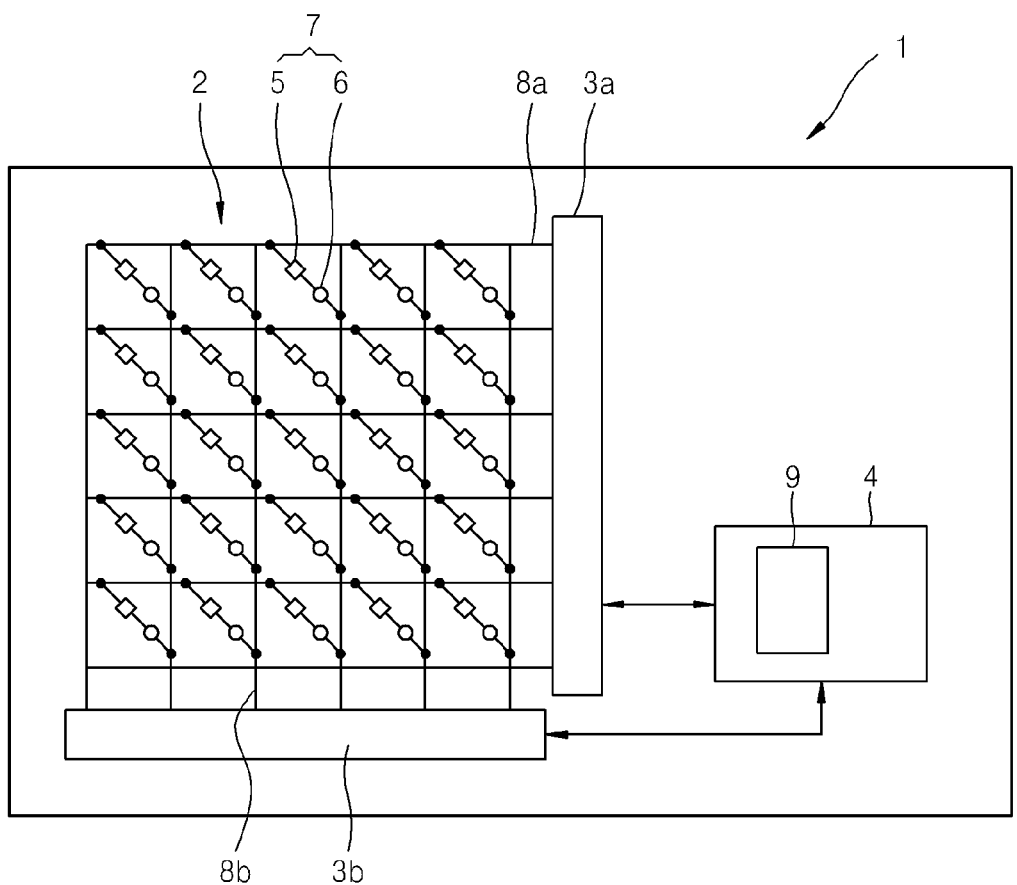
FIG. 1 is a schematic circuit diagram of a phase change memory device according to example embodiments of inventive concepts.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic circuit diagram of a phase change memory device 1 according to example embodiments of inventive concepts.

Referring to FIG. 1, the phase change memory device 1 may include a phase change memory array 2, a row decoder 3a, a column decoder 3b, and/or a control circuit 4.

The phase change memory array 2 is arranged in a form of matrix and includes a plurality of memory device unit cells 7 each including a memory portion 5 and an access portion 6.

The memory portion 5 may include phase-change materials. A state of the memory portion 5 may be determined according to the amount of a current supplied via bitlines (not shown). Example embodiments of inventive concepts, where a phase-change random access memory (PRAM) including phase-change materials acts as a memory device of the memory portion 5 will be described.

When the memory portion 5 includes a phase-change material layer, the phase-change material layer is heated at a temperature between a crystallization temperature and a melting point for a predetermined or desired amount of time and then is slowly cooled, the phase-change material layer is in a crystalline state. The crystalline state is referred to as a set state and may be a state in which data '0' is stored. On the other hand, when the phase-change material layer is heated at a temperature over the melting point and then is quickly cooled, the phase-change material layer is in an amorphous state. The amorphous state is referred to as a reset state and may be a state in which data '1' is stored. Thus, a heat may be occurred by supplying a current to an electrode contacted to the phase-change material layer and then the phase-change material layer may reversibly changed between the crystalline state having relatively low resistance value and the amorphous state having relatively high resistance value. According to the resistance value of the phase-change material layer, data '0' or '1' may be stored and the stored data may be read thereafter. In addition, the crystalline state of the phase-change materials may be changed by an electrical signal such as a current or voltage, an optical signal, or radioactive rays.

The access portion 6 controls current supply to the memory portion 5 according to a voltage of a wordline. The access portion 6 may include an access device 6 and the access device 6 may be a diode, a bipolar transistor, or a MOS transistor.

In addition, the plurality of memory device unit cells 7 are electrically connected to a first address line 8a and a second address line 8b. The first address line 8a and the second address line 8b are arranged at a predetermined or desired angle in a two-dimensional (2D) manner. The predetermined or desired angle may be a right angle. However, inventive concepts are not limited thereto. One of the first address line 8a and the second address line 8b may be a bitline, and the other one thereof may be a wordline.

The row decoder 3a may communicate with the phase change memory array 2 via the first address line 8a. The column decoder 3b may communicate with the phase change memory array 2 via the second address line 8b.

The control circuit 4 may transmit a row address signal to the row decoder 3a, and the row decoder 3a may decode the row address signal and may transmit the decoded row address signal to the phase change memory array 2 via the first address line 8a. In addition, the control circuit 4 may transmit a column address signal to the column decoder 3b, and the column decoder 3b may decode the column address signal and may transmit the decoded column address signal to the phase change memory array 2 via the second address line 8b. Although not shown, a sense amplifier (not shown) and/or a page buffer (not shown) may be further disposed between the row decoder 3a and the control circuit 4 or between the column decoder 3b and the control circuit 4.

The control circuit 4 may further include a power circuit unit 9. The power circuit unit 9 may perform a function of stably supplying a current and/or voltage to the phase change memory array 2 and may increase or decrease an external voltage to a level suitable for the phase change memory array 2. In addition, the power circuit unit 9 may include a capacitor so as to stably supply a high current and/or voltage.

Figure 2:
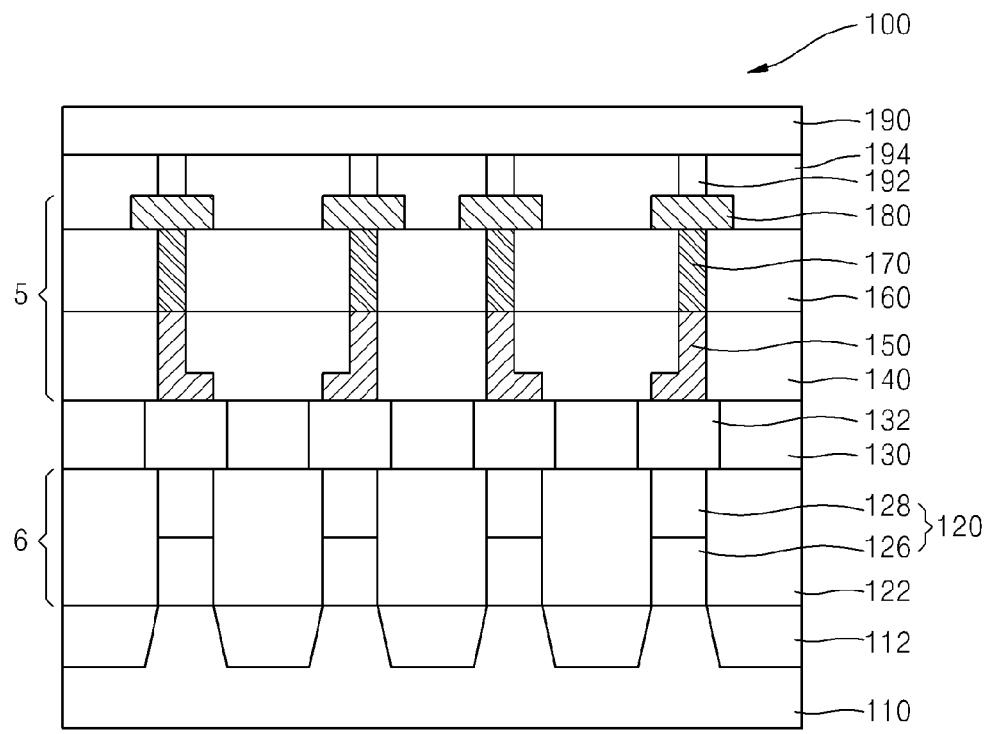
FIG. 2 is a schematic cross-sectional view of a phase change memory device according to example embodiments of inventive concepts.

FIG. 2 is a schematic cross-sectional view of a phase change memory device 100 according to example embodiments of inventive concepts.

Referring to FIG. 2, the phase change memory device 100 may include a memory portion 5 and an access portion 6. In the memory portion 5, a storage structure including a lower electrode layer 150, a phase-change material layer 170, and an upper electrode layer 180 may be disposed. The access portion 6 may include an access device 6 and the access device 6 may be a diode, a bipolar transistor, or a MOS transistor.

A device isolation layer 112 may be disposed on a substrate 110. A first interlayer insulating layer 122 may be disposed on the substrate 110 and the device isolation layer 112. The diode 120 may be disposed on a portion of the substrate 110 between the device isolation layers 112 and/or within the first interlayer insulating layer 122. The diode 120 may include a layer 126 of first conductivity type and a layer 128 of second conductivity type having different conductivity types and may perform the function of a diode.

A second interlayer insulating layer 130 may be disposed on the first interlayer insulating layer 122. A plug 132 that is physically and/or electrically connected to the diode 120 may be disposed within the second interlayer insulating layer 130. A first mold insulating layer 140 and a second mold insulating layer 160 may be disposed on the second interlayer insulating layer 130.

The lower electrode layer 150, the phase-change material layer 170, and the upper electrode layer 180 may constitute the storage structure. Data may be stored according to a material state of the phase-change material layer 170 interposed between the lower electrode layer 150 and the upper electrode layer 180. In example embodiments, the lower electrode layer 150 may perform the function of a heater that changes the material state of the phase-change material layer 170, for example, into a crystalline state or an amorphous state. In addition, the lower electrode layer 150 and the phase-change material layer 170 may have an integral structure, for example, in the form of a dash cell. However, this structure is an example, and example embodiments of inventive concepts are not limited thereto. Various example embodiments of a structure of the lower electrode layer 150 and the phase-change material layer 170 will be described later with reference to FIGS. 13 through 21.

The storage structure may be electrically connected to the diode 120. In example embodiments, the lower electrode layer 150 may be physically and/or electrically connected to the plug 132. The lower electrode layer 150 may be disposed within the first mold insulating layer 140, and the phase-change material layer 170 may be disposed within the second mold insulating layer 160, and the upper electrode layer 180 may be disposed on the second mold insulating layer 160.

A third interlayer insulating layer 194 may be disposed on the second mold insulating layer 160. The third interlayer insulating layer 194 may surround the upper electrode layer 180. A bitline 190 may be disposed on the third interlayer insulating layer 194. A bitline contact plug 192 may be disposed within the third interlayer insulating layer 194 and may electrically connect the upper electrode layer 180 and the bitline 190.

FIGS. 3 through 12 are schematic cross-sectional views illustrating a method of manufacturing the phase change memory device 100 illustrated in FIG. 2, according to example embodiments of inventive concepts.

Figure 3:
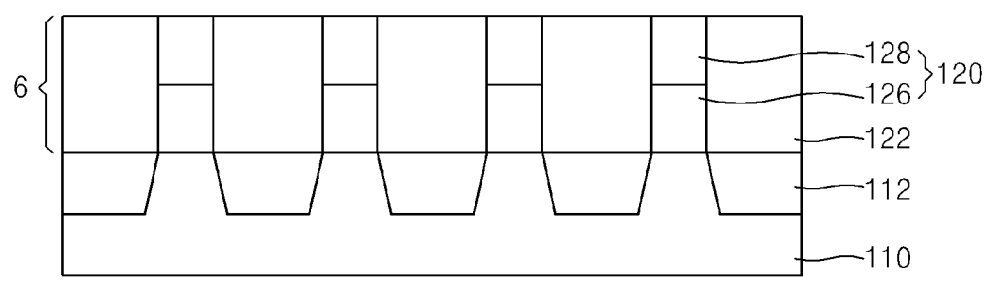
FIGS. 3 through 12 are schematic cross-sectional views illustrating a method of manufacturing a phase change memory device, according to example embodiments of inventive concepts.

Referring to FIG. 3, a substrate 110 on which an access portion 6 is formed, is provided. The access portion 6 may be disposed on an uppermost surface of the substrate 110. The access portion 6 may correspond to the access portion 6 of FIG. 1.

The substrate 110 may include a dielectric layer including silicon oxide, titanium oxide, aluminum oxide, zirconium oxide, or hafnium oxide, a conductive layer including titanium (Ti), titanium nitride (TiN), aluminum (Al), tantalum (Ta), tantalum nitride (TaN) and/or titanium aluminum nitride (TiAlN), or a semiconductor layer formed of silicon (Si), silicon-germanium (SiGe), and/or silicon carbide (SiC). In addition, the substrate 110 may include an epitaxial layer, a silicon-on-insulator (SOI) layer, and/or a semiconductor-on-insulator (SEOI) layer. In addition, although not shown, the substrate 110 may further include a wordline (not shown), a bitline (not shown), or other semiconductor devices.

The substrate 110 includes a device isolation layer 112 disposed in a portion of the substrate 110. The device isolation layer 112 may include an insulating material, for example, an oxide, a nitride, or an oxynitride and may include at least one selected from the group consisting of silicon oxide, silicon nitride, and silicon oxynitride. The device isolation layer 112 may be formed by using sputtering, chemical vapor deposition (CVD), plasma enhanced CVD (PECVD), atomic layer deposition (ALD), or similar processes. In addition, the device isolation layer 112 may be formed by using a photolithography method, an etch method, chemical mechanical polishing (CMP), or a planarization process using a dry etch. In addition, a case where the methods are used for other layers that will be described later involves the technical spirit of the inventive concept.

The access portion 6 is disposed on the substrate 110. The access portion 6 may include an access device 6 and a first interlayer insulating layer 122 that surrounds the access device 6. The access device 6 may be a diode 120, a bipolar transistor, or a MOS transistor.

The first interlayer insulating layer 122 may include an insulating material, for example, an oxide, a nitride, or an oxynitride and may include at least one selected from the group consisting of silicon oxide, silicon nitride, and silicon oxynitride.

The diode 120 may be disposed within the first interlayer insulating layer 122 and/or may be disposed on a portion of the substrate 110 between the device isolation layers 112. The diode 120 may include polysilicon, for example, and may further include a layer 126 of first conductivity type and a layer 128 of second conductivity type having opposite conductivity types. For example, the layer 126 of first conductivity type may include impurities of p-type conductivity type, and the layer 128 of a second conductivity type may include impurities of n-type conductivity type, or vice versa. The layer 126 of first conductivity type and the layer 128 of second conductivity type may be formed by impurity diffusion or ion implantation. In addition, example embodiments of inventive concepts may include a transistor instead of the diode 120 as an access device.

Figure 4:
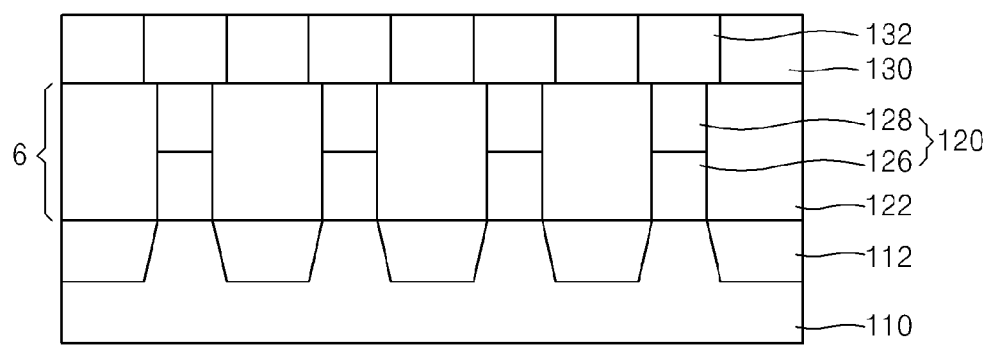

Referring to FIG. 4, a second interlayer insulating layer 130 is formed on the access portion 6, and a plug 132 that is physically and/or electrically connected to the diode 120 is formed within the second interlayer insulating layer 130. The process of FIG. 4 is an optional process and thus may be omitted.

The second interlayer insulating layer 130 may include an insulating material, for example, an oxide, a nitride, or an oxynitride and may include at least one selected from the group consisting of silicon oxide, silicon nitride, and silicon oxynitride. In addition, the first interlayer insulating layer 122 and the second interlayer insulating layer 130 may be formed of the same material or different materials.

The plug 132 may perform a function of reducing a contact resistance between the diode 120 and a lower electrode layer (see 150 of FIG. 2) to be formed later. The plug 132 may include a conductive material. In detail the plug 132 may include at least one selected from the group consisting of tungsten (W), titanium tungsten (TiW), and tantalum tungsten (TaW). In FIG. 4, a planar area of the plug 132 is larger than a planar area of the diode 120. However, this is just an example. A case where the planar area of the plug 132 is the same as or smaller than the planar area of the diode 120 is included in the technical spirit of inventive concepts.

Figure 5:
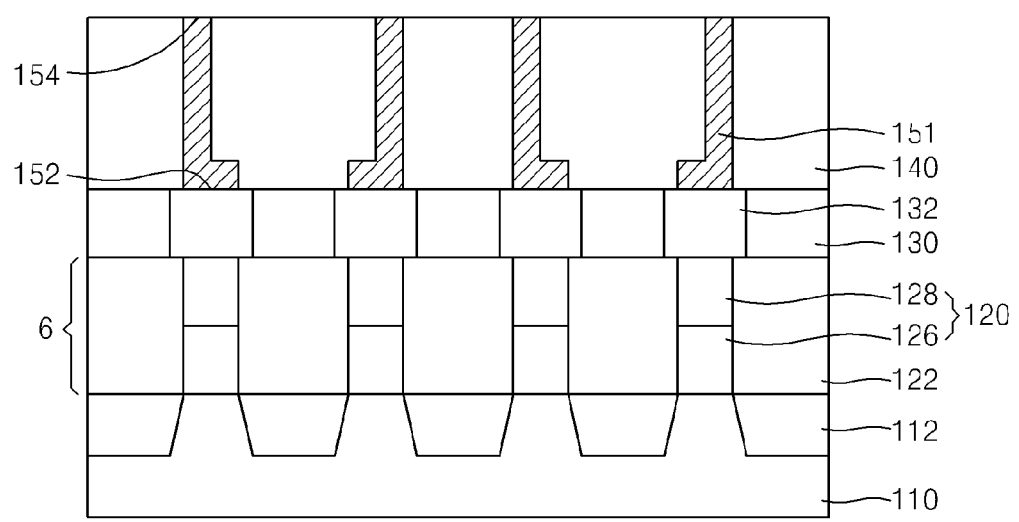

Referring to FIG. 5, a first mold insulating layer 140 is formed on the second interlayer insulating layer 130, and a preliminary lower electrode layer 151 is formed on the plug 132. The first mold insulating layer 140 may be formed to surround the preliminary lower electrode layer 151.

A lowermost surface 152 of the preliminary lower electrode layer 151 may be wider, and an uppermost surface 154 thereof may be narrower. The lowermost surface 152 of the preliminary lower electrode layer 151 may be physically and/or electrically connected to the plug 132. Since the lowermost surface 152 of the preliminary lower electrode layer 151 is wide, a contact area in which the lower electrode layer (see 150 of FIG. 2) to be formed later contacts the plug 132, may increase. Thus, the lower electrode layer (see 150 of FIG. 2) and the plug 132 may be electrically connected to each other with greater reliability. In addition, since the uppermost surface 154 of the preliminary lower electrode layer 151 is narrower, a contact area in which a phase-change material layer (see 170 of FIG. 2) to be formed later contacts the plug 132, may decrease. Thus, the size of a current applied to the phase-change material layer 170, for example, the size of a reset current, may be decreased. However, the shape of the preliminary lower electrode layer 151 is just an example, and example embodiments of inventive concepts are not limited thereto.

A first mold insulating layer 140 may include an oxide, a nitride, or an oxynitride and may include at least one selected from the group consisting of silicon oxide, silicon nitride, and silicon oxynitride.

The preliminary lower electrode layer 151 may include at least one selected from the group consisting of titanium (Ti), tantalum (Ta), molybdenum (Mo), hafnium (Hf), zirconium (Zr), chrome (Cr), tungsten (W), niobium (Nb), and vanadium (V). In addition, the preliminary lower electrode layer 151 may include a combination of at least one of the above-described materials and at least one selected from the group consisting of nitrogen (N), carbon (C), aluminum (Al), boron (B), phosphor (P), oxygen (O), and silicon (Si). In addition, the preliminary lower electrode layer 151 may include at least one selected from the group consisting of TiN, TiW, TiCN, TiAlN, TiSiC, TiSiN, TaN, TaW, TaCN, TaAlN, TaSiC, TaSiN, MoN, MoW, MoCN, MoAlN, MoSiC, and MoSiN.

The first mold insulating layer 140 and the preliminary lower electrode layer 151 may have different etch selectivities with respect to a selected etchant. While a portion of the first mold insulating layer 140 are removed in a subsequent process (see FIG. 6) based on the etch selectivities, the preliminary lower electrode layer 151 may not be removed and may remain.

Hereinafter, a case where the first mold insulating layer 140 includes a silicon nitride and the preliminary lower electrode layer 151 includes titanium nitride will be described. However, this is just an example, and example embodiments of inventive concepts are not limited thereto.

Figure 6:
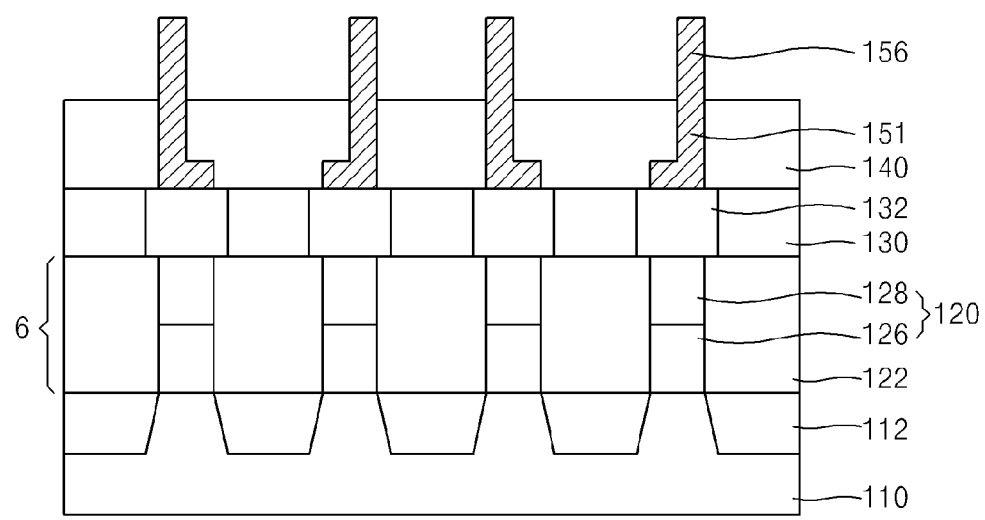

Referring to FIG. 6, upper regions of the first mold insulating layer 140 are recessed so that a portion of the preliminary lower electrode layer 151 protrudes and a protruding region 156 is formed. A process of recessing the first mold insulating layer 140 may be performed using a photolithography process and a wet or dry etch process, or etch-back, or a combination thereof. An etchant for the recessing process has to have characteristics that the first mold insulating layer 140 is selectively etched and the preliminary lower electrode layer 151 is not or only minimally etched. The etchant may include phosphoric acid, for example.

Figure 7:
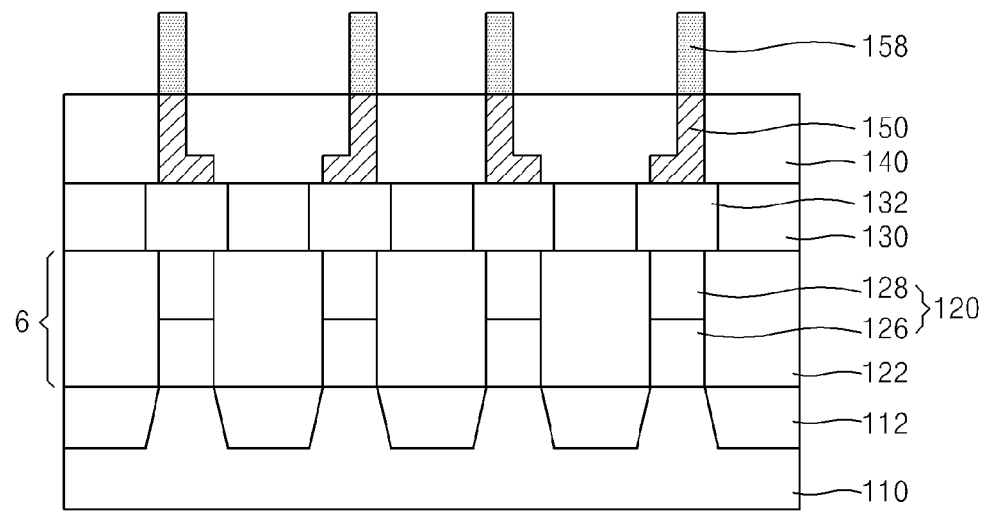

Referring to FIG. 7, the protruding region 156 of the preliminary lower electrode layer 151 is treated to form a sacrificial layer 158. Accordingly, a lower electrode layer 150 is formed from the preliminary lower electrode layer 151. In example embodiments, the remaining portion of the preliminary lower electrode layer 151 forms the lower electrode layer 150. The treatment for the preliminary lower electrode layer 151 may be an oxidation treatment or nitridation treatment and may be performed using plasma oxidation/nitridation, thermal oxidation/thermal nitridation, or ashing. The sacrificial layer 158 may have a different etch selectivity from an etch selectivity of the lower electrode 150. When the lower electrode layer 150 includes nitride, the sacrificial layer 158 may include an oxide or an oxynitride. Alternatively, in example embodiments where the lower electrode layer 150 includes an oxide or an oxynitride the sacrificial layer 158 includes nitride. In addition, when the lower electrode layer 150 includes titanium nitride (TiN), the sacrificial layer 158 may include titanium oxide (TiO) or titanium oxynitride (TiON). In addition, the sacrificial layer 158 may be another nitride.

In FIG. 7, the lower electrode layer 150 and the sacrificial layer 158 have the same widths. However, this is just an example, and the widths may be different from each other.

Figure 8:
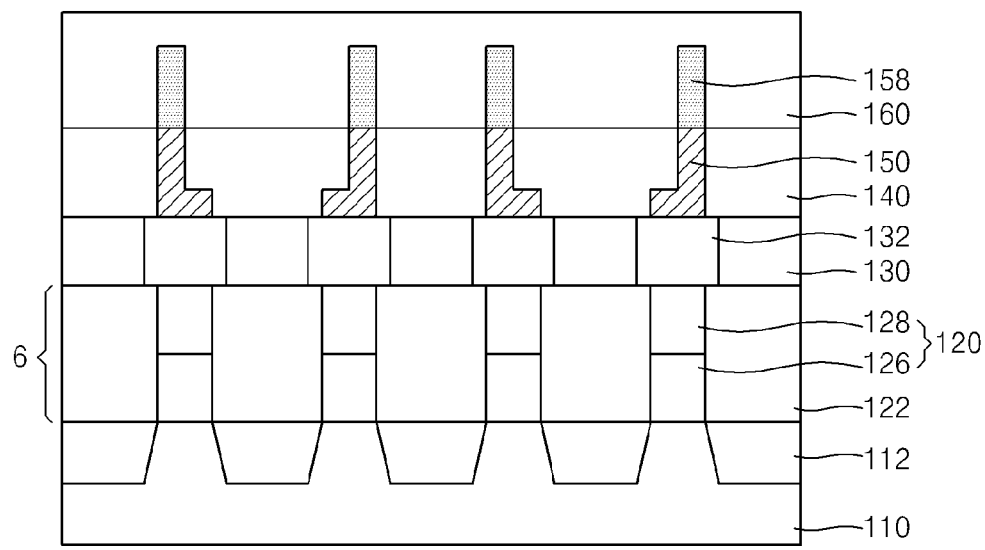

Referring to FIG. 8, a second mold insulating layer 160 is formed on the first mold insulating layer 140. The second mold insulating layer 160 may be formed to surround and cover the sacrificial layer 158. The second mold insulating layer 160 may include an oxide, a nitride, or an oxynitride and may include at least one selected from the group consisting of silicon oxide, silicon nitride, and silicon oxynitride. The first mold insulating layer 140 and the second mold insulating layer 160 may include the same material or different materials. The second mold insulating layer 160 and the sacrificial layer 158 may have different etch selectivities with respect to a selected etchant. While the sacrificial layer 158 is removed in a subsequent process (see FIG. 10) based on the etch selectivities, the second mold insulating layer 160 may not be removed and may remain. For example, when the sacrificial layer 158 is an oxide layer, the second mold insulating layer 160 may be an oxynitride layer or a nitride layer, and when the sacrificial layer 158 is a nitride layer, the second mold insulating layer 160 may be an oxide layer or an oxynitride layer, and when the sacrificial layer 158 is an oxynitride layer, the second mold insulating layer 160 may be an oxide layer or a nitride layer.

Although FIGS. 6-8 discussed above, illustrate recessing the first mold insulating layer 140, then forming the sacrificial layer 158, and then forming the second mold insulating layer 160, these operations may be rearranged in any order. For example, forming the sacrificial layer 158 may be performed before recessing the first mold insulating layer 140.

Figure 9:
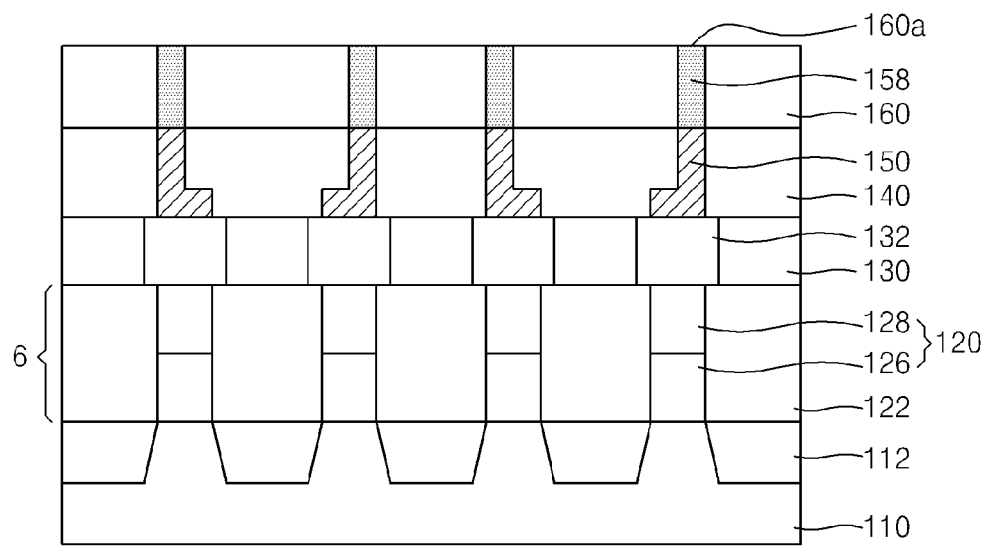

Referring to FIG. 9, the second mold insulating layer 160 is planarized to expose an uppermost surface 160a of the sacrificial layer 158. The planarization process may be performed by using CMP, etch-back, or a combination thereof.

Figure 10:
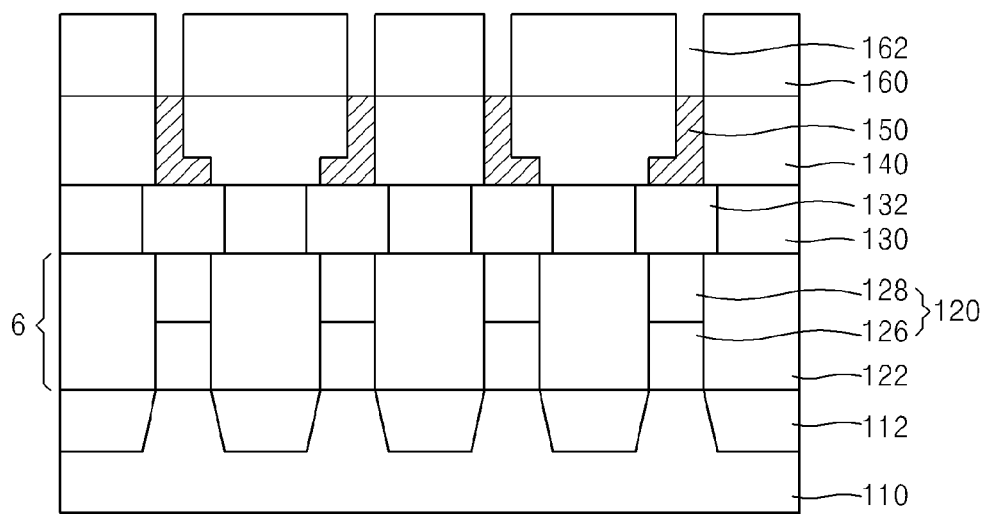

Referring to FIG. 10, the sacrificial layer 158 is removed to form an opening 162 for exposing the lower electrode layer 150. A process of forming the opening 162 may be performed using a photolithography process and a wet or dry etch process, etch-back, or a combination thereof. An etchant for forming the opening 162 has to have characteristics that the sacrificial layer 158 is selectively etched and the second mold insulating layer 160 is not or only minimally etched. When the sacrificial layer 158 includes oxide, the etchant may include fluoric oxide, for example, and may remove the sacrificial layer 158 by performing a wet etch process.

Figure 11:
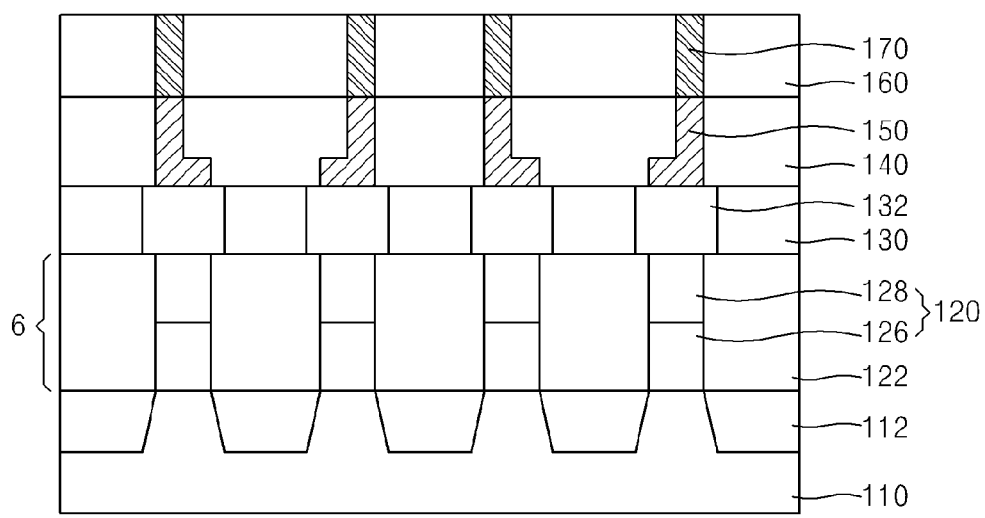

Referring to FIG. 11, the opening 162 is filled with a phase-change material to form a phase-change material layer 170. In other words, the phase-change material layer 170 that is physically and/or electrically connected to the lower electrode layer 150 is formed by replacing the sacrificial layer 158 of FIG. 9. Although not shown, the phase-change material layer 170 is formed to cover the lower electrode layer 150, and the lower electrode layer 150 may be exposed by performing a planarization process.

The phase-change material layer 170 may include phase-change materials that may store data according to crystalline states, as described above, for example, a chalcogenide material, and may include at least one selected from the group consisting of Ge—Te, Ge—Sb—Te, Ge—Te—Se, Ge—Te—As, Ge—Te—Sn, Ge—Te—Ti, Ge—Bi—Te, Ge—Sn—Sb—Te, Ge—Sb—Se—Te, Ge—Sb—Te—S, Ge—Te—Sn—O, Ge—Te—Sn—Au, Ge—Te—Sn—Pd, Sb—Te, Se—Te—Sn, Sb—Se—Bi, In—Se, In—Sb—Te, Sb—Se, and Ag—In—Sb—Te.

In example embodiments, the phase-change material layer 170 may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material film may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase-change material layer 170 may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase-change material layer 170 may is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the phase-change material layer 170 may be made of a transition metal oxide having multiple resistance states, as described above. For example, e the phase-change material layer 170 may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). the phase-change material layer 170 may be a chemical compound including one or more elements selected from the group consisting of S, Se, Te, As, Sb, Ge, Sn, In and Ag.

In addition, the phase-change material layer 170 may further include a metallic material. In addition, at least one selected from the group consisting of carbon (C), nitrogen (N), silicon (Si), oxygen (O), bismuth (Bi), and tin (Sn) may be doped into the phase-change material layer 170, and a driving current of a memory device may be reduced due to the doping process.

According to example embodiments of inventive concepts, an operation of forming the phase-change material layer 170 may further include forming a sidewall insulating layer 172 within a portion of the opening 162, wherein the sidewall insulating layer 172 and the phase-change material layer 170 may contact each other. Example embodiments of the phase-change material layer 170 and the sidewall insulating layer 172 are shown in FIG. 14 and FIGS. 16 through 21.

Figure 12:
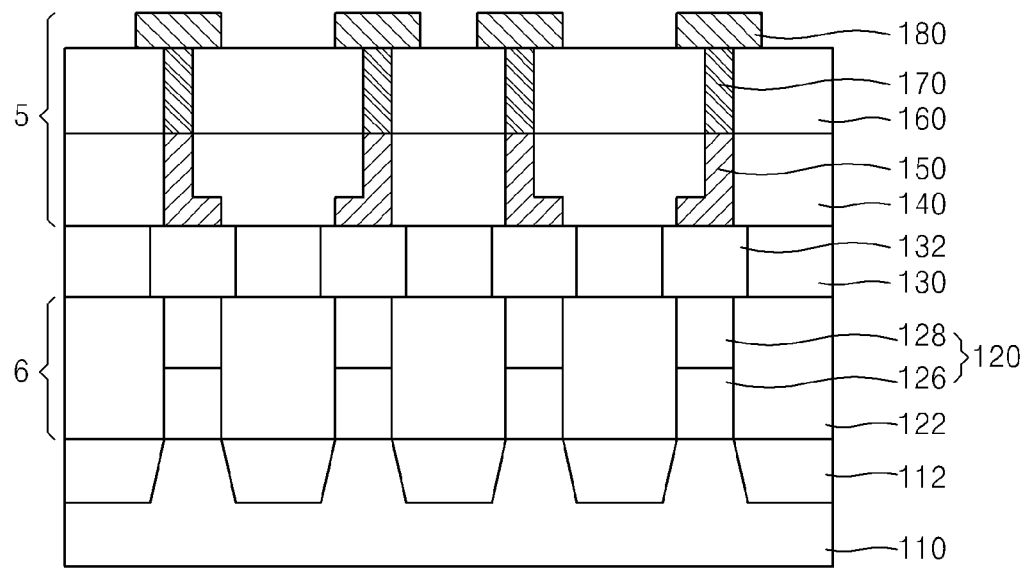

Referring to FIG. 12, an upper electrode layer 180 is formed on the phase-change material layer 170. The lower electrode layer 150, the phase-change material layer 170, and the upper electrode layer 180 constitute a memory portion 5. The memory portion 5 may correspond to the memory portion 5 of FIG. 1.

The upper electrode layer 180 may be physically and/or electrically connected to the phase-change material layer 170. The upper electrode layer 180 may include one selected from the group consisting of carbon nitride (CN), titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), cobalt silicon (CoSi), tungsten silicon (WSi), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbon nitride (TiCN), and tantalum carbon nitride (TaCN).

Subsequently, the phase change memory device 100 of FIG. 2 may be completely manufactured by performing subsequent processes. The subsequent processes may include operations of forming the bitline contact plug 192 that is physically and/or electrically connected to the upper electrode layer 180 and forming the bitline 190 that is physically and/or electrically connected to the bitline contact plug 192. Thus, the upper electrode layer 180 and the bitline 190 are physically and/or electrically connected to each other. The upper electrode layer 180 and the bitline contact plug 192 may be surrounded by the third interlayer insulating layer 194.

FIGS. 13 through 21 illustrate the lower electrode layer 150 and the phase-change material layer 170 of FIG. 2, according to example embodiments of inventive concepts.

Figure 13:
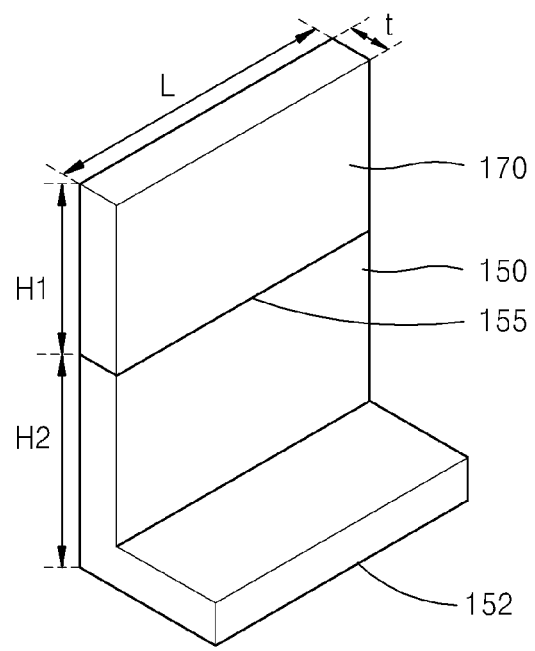
FIGS. 13 through 21 illustrate embodiments of a lower electrode and a phase-change material layer, according to example embodiments of inventive concepts.

Referring to FIG. 13, at least a portion of the lower electrode layer 150 may have a rectangular shape in which a length of one side is larger than a length of another side in a horizontal plane. In addition, the phase-change material layer 170 may have, for example, a rectangular shape corresponding to the lower electrode layer 150. In example embodiments, the uppermost surface of the lower electrode layer 150 and the lowermost surface of the phase-change material layer 170 may have the same shape, for example, a rectangular shape, and may contact each other. A length L of the phase-change material layer 170 may be in the range of 5 to 100 nm, for example, in the range of 20 to 30 nm. A thickness t of the phase-change material layer 170 may be in the range of 1 to 20 nm, for example, in the range of 5 to 10 nm. A height H1 of the phase-change material layer 170 may be in the range of 5 to 100 nm, for example, in the range of 30 to 50 nm. A length and a thickness of the lower electrode layer 150 may be the same as the length L and the thickness t of the phase-change material layer 170. A height H2 of the lower electrode layer 150 may be in the range of 5 to 100 nm, for example, in the range of 40 to 60 nm. Thus, the lower electrode layer 150 and the phase-change material layer 170 may be formed in an integral structure and may constitute a dash cell. In addition, a lowermost surface 152 of the lower electrode layer 150 may be wide, and an uppermost surface 155 thereof may be narrow. Since the lowermost surface 152 of the lower electrode layer 150 is wider, a contact area in which the lower electrode layer 150 contacts the plug 132, may increase. Thus, the lower electrode layer 150 and the plug 132 may be electrically connected to each other with greater reliability. In addition, since the uppermost surface 155 of the lower electrode layer 150 is narrow, a contact area in which the lower electrode layer 150 contacts a phase-change material layer (see 170 of FIG. 2) to be formed later, may decrease. Thus, the size of a current applied to the phase-change material layer 170, for example, the size of a reset current, may be decreased.

However, these shapes and numerical values are just examples, and example embodiments of inventive concepts are not limited thereto.

Figure 14:
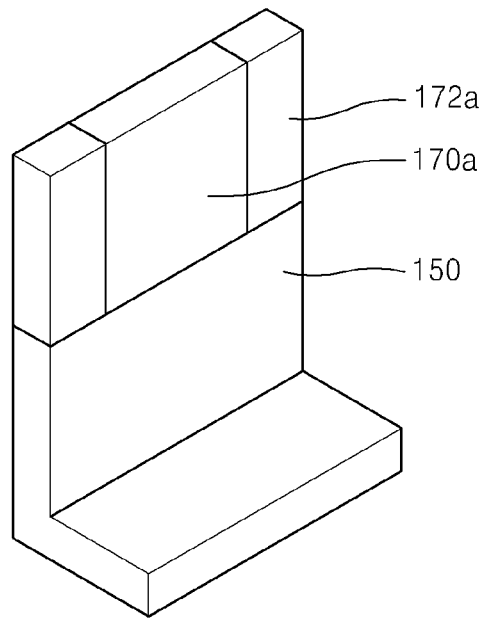
Figure 15:
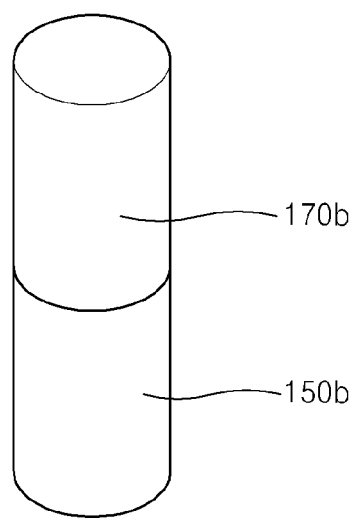

Referring to FIG. 14, a phase-change material layer 170a may be disposed on one portion of the lower electrode layer 150, and a sidewall insulating layer 172a may be disposed on the other portion of the lower electrode layer 150. Sidewall insulating layers 172a may be disposed on both sidewalls of the phase-change material layer 170a. Thus, a contact area in which the phase-change material layer 170a and the lower electrode layer 150 contact each other, may decrease, and the size of a current applied to the phase-change material layer 170a, for example, the size of a reset current, may be decreased. Relative positions of the phase-change material layer 170a and the sidewall insulating layer 172 are just examples, and example embodiments of inventive concepts are not limited thereto. The sidewall insulating layer 172a may include an insulating material, for example, oxide, nitride, or oxynitride. The sidewall insulating layer 172 may have a multi-layered structure. The multi-layered structure may be constitute by using silicon nitride, silicon oxinitride, silicon carbide, silicon oxide, aluminum oxide, aluminum nitride, hafnium oxide, zirconium oxide, titanium oxide, nickel oxide, and a combination thereof. Referring to FIG. 15, a lower electrode layer 150b and a phase-change material layer 170b have a circular cylinder shape. The lower electrode layer 150b and the phase-change material layer 170b may have a corresponding shape. In example embodiments, an uppermost surface of the lower electrode layer 150b and a lowermost surface of the phase-change material layer 170b may have the same shape, for example, a circular shape, and may contact each other.

Figure 16:
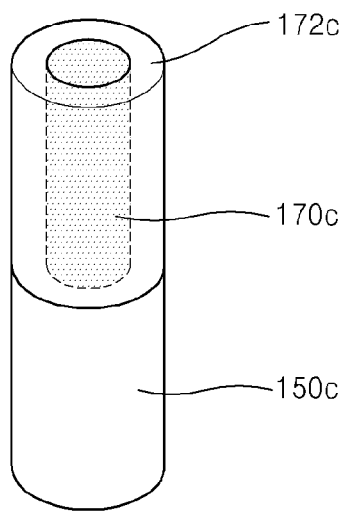

Referring to FIG. 16, a phase-change material layer 170c may be disposed on one portion of a lower electrode layer 150c, and a sidewall insulating layer 172c may be disposed on the other portion of the lower electrode layer 150c. The phase-change material layer 170c may be disposed on an upper portion of a center of the lower electrode layer 150c, and the sidewall insulating layer 172c may be disposed to surround a circumferential portion of the phase-change material layer 170c so that the phase-change material layer 170c may be disposed in the sidewall insulating layer 172c, or the sidewall insulating layer 172c may be disposed on an upper portion of an exterior of the lower electrode layer 150c. Thus, a contact area between the phase-change material layer 170c and the lower electrode layer 150c may decrease, and the size of a current applied to the phase-change material layer 170c may be decreased.

Figure 17:
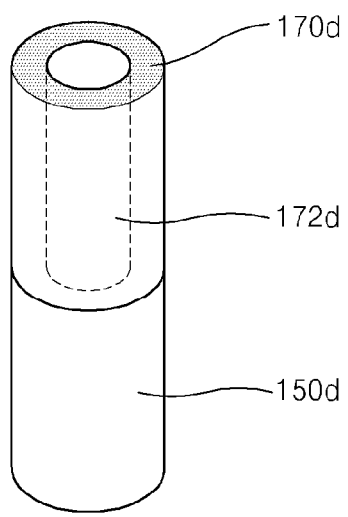

Referring to FIG. 17, a phase-change material layer 170*d* may be disposed on one portion of a lower electrode layer 150*d*, and a sidewall insulating layer 172*d* may be disposed on the other portion of the lower electrode layer 150*d*. The sidewall insulating layer 172*d* may be disposed on an upper portion of a center of the lower electrode layer 150*d*, and the phase-change material layer 170*d* may be disposed to surround a circumferential portion of the sidewall insulating layer 172*d* so that the sidewall insulating layer 172*d* may be disposed in the phase-change material layer 170*d*, or the phase-change material layer 170*d* may be disposed on an upper portion of an exterior of the lower electrode layer 150*d*. Thus, a contact area between the phase-change material layer 170*d* and the lower electrode layer 150*d* may decrease, and the size of a current applied to the phase-change material layer 170*d* may be decreased.

FIGS. 18 through 21 illustrate various example embodiments in a case where a phase-change material layer is disposed to surround an exterior of a sidewall insulating layer. However, these are examples, and example embodiments of inventive concepts are not limited thereto. The sidewall insulating layer may be disposed to surround an exterior of the phase-change material layer, and this may be applied to the following embodiments of FIGS. 19 and 20.

Figure 18:
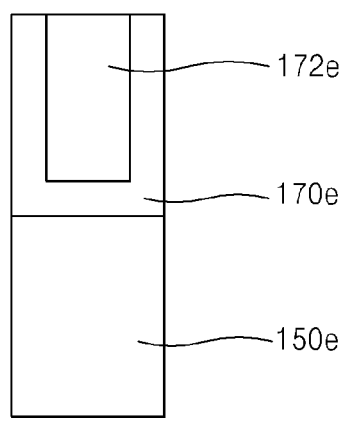

Referring to FIG. 18, a phase-change material layer 170*e* may be disposed on an upper portion of a lower electrode layer 150*e* so that the phase-change material layer 170*e* may contact the entire surface of the uppermost surface of the lower electrode layer 150*e*. In addition, a sidewall insulating layer 172*e* may be disposed in the phase-change material layer 170*e*, and the sidewall insulating layer 172*e* may not contact the lower electrode layer 150*e*. Thus, the phase-change material layer 170*e* may have a cup shape.

Figure 19:
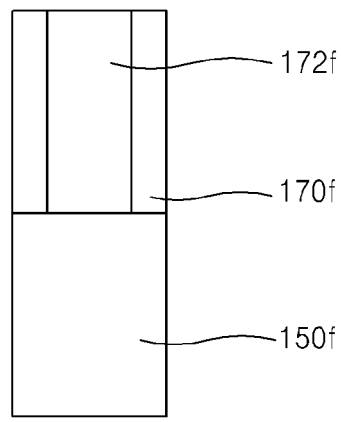

Referring to FIG. 19, a phase-change material layer 170*f* and a sidewall insulating layer 172*f* may be disposed on a lower electrode layer 150*f* in such a way that the phase-change material layer 170*f* contacts a portion of an uppermost surface of the lower electrode layer 150*f*, for example, an exterior of the lower electrode layer 150*f* and the sidewall insulating layer 172*f* contacts the other portion of the uppermost surface of the lower electrode layer 150*f*, for example, a center of the lower electrode layer 150*f*. The phase-change material layer 170*f* may be disposed to surround a circumferential portion of the sidewall insulating layer 172*f*. The phase-change material layer 170*f* may have a ring shape.

Figure 20:
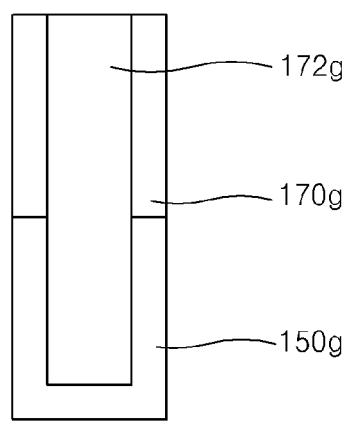

Referring to FIG. 20, a sidewall insulating layer 172*g* may extend in an interior of a lower electrode layer 150*g*. Thus, a phase-change material layer 170*g* and the sidewall insulating layer 172*g* may be disposed on the lower electrode layer 150*g* in such a way that an uppermost surface of an exterior of the lower electrode layer 150*g* and the phase-change material layer 170*g* contact each other and the sidewall insulating layer 172*g* contacts sidewalls and a bottom of an interior of the lower electrode layer 150*g*. The phase-change material layer 170*g* may be disposed to surround an upper portion of the sidewall insulating layer 172*g*, and the lower electrode layer 150*g* may be disposed to surround a lower portion of the sidewall insulating layer 172*g*. The phase-change material layer 170*g* may have a ring shape, and the lower electrode layer 150*g* may have a cup shape.

Figure 21:
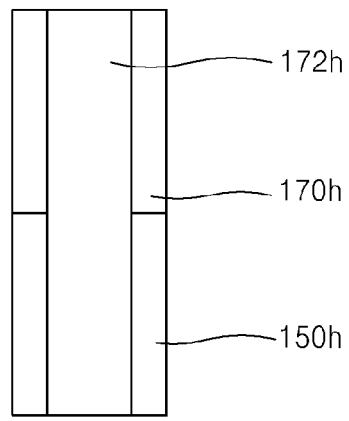

Referring to FIG. 21, a sidewall insulating layer 172*h* may extend in an interior of a lower electrode layer 150*h* to be formed through the lower electrode layer 150*h*. Thus, a phase-change material layer 170*h* is disposed on the lower electrode layer 150*h* so that an uppermost surface of an exterior of the lower electrode layer 150*h* and the phase-change material layer 170*h* may contact each other. The sidewall insulating layer 172*h* is disposed to contact sidewalls of an interior of the lower electrode layer 150*h*. The phase-change material layer 170*h* may be disposed to surround an upper portion of the sidewall insulating layer 172*h*, and the lower electrode layer 150*h* may be disposed to surround a lower portion of the sidewall insulating layer 172*h*. Each of the phase-change material layer 170*h* and the lower electrode layer 150*h* may have a ring shape.

In the example embodiments of FIGS. 15 through 21, the shapes of the lower electrode layers 150*b*, 150*c*, 150*d*, 150*e*, 150*f*, 150*g*, and 150*h*, the shapes of the phase-change material layers 170*b*, 170*c*, 170*d*, 170*e*, 170*f*, 170*g*, and 170*h*, and the shapes of the sidewall insulating layers 172*c*, 172*d*, 172*e*, 172*f*, 172*g*, and 172*f* are examples, and they may have various shapes, for example, a circular cylinder shape, a circular cone shape, a truncated circular cone shape, a polygonal cylinder shape, a polygonal pyramid shape, and a truncated polygonal pyramid shape, and other similar shapes. The sidewall insulating layers 172*c*, 172*d*, 172*e*, 172*f*, 172*g*, and 172*f* may have a multi-layered structure. The multi-layered structure may be constitute by using silicon nitride, silicon oxinitride, silicon carbide, silicon oxide, aluminum oxide, aluminum nitride, hafnium oxide, zirconium oxide, titanium oxide, nickel oxide, and a combination thereof.

Figure 22:
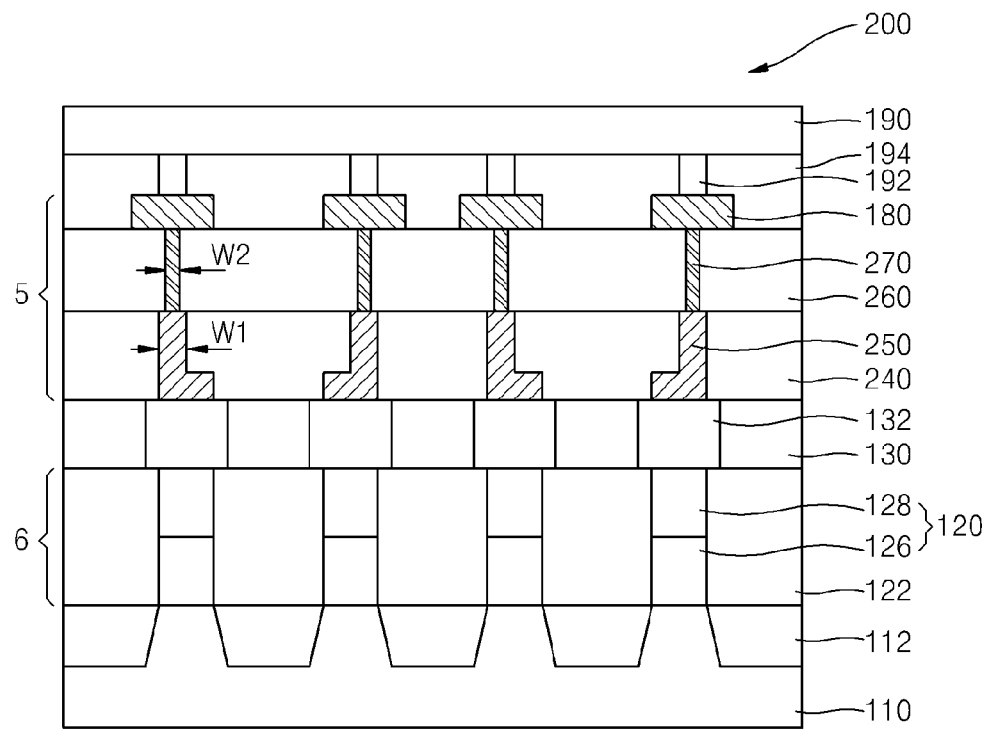
FIGS. 22 and 23 are schematic cross-sectional views of phase change memory devices according to example embodiments of inventive concepts.
Figure 23:
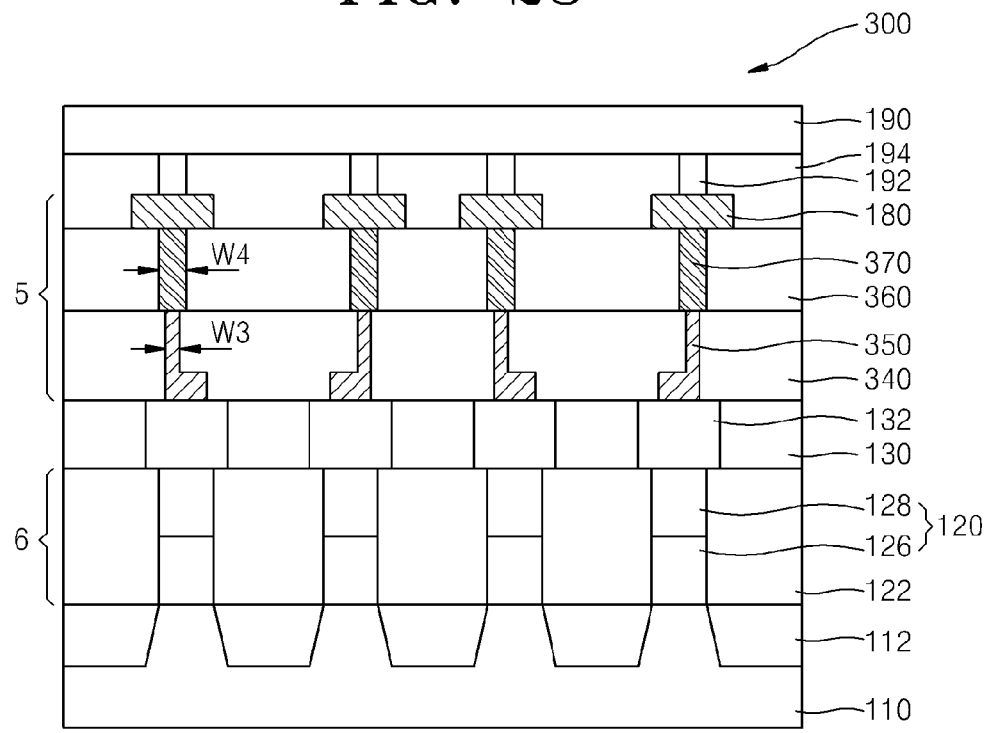

FIGS. 22 and 23 are schematic cross-sectional views of phase change memory devices 200 and 300 according to example embodiments of inventive concepts. The embodiments of FIGS. 22 and 23 involve cases where a width of a phase-change material layer is different from a width of a lower electrode layer, compared to the example embodiments of FIG. 2. A redundant description of features in common with the example embodiment of FIG. 2 will be omitted.

In the phase change memory device 200 of FIG. 22, a width W1 of a lower electrode layer 250 disposed in a first mold insulating layer 240 may be larger than a width W2 of a phase-change material layer 270 disposed in a second mold insulating layer 260. For example, the width W1 of the lower electrode layer 250 may be substantially same as the width of the lower electrode layer 150 of FIG. 2. The width W2 of the phase-change material layer 270 may be substantially smaller than the width of the phase-change material layer 170 of FIG. 2. The width W1 of the lower electrode layer 250 may be substantially larger than the width of the lower electrode layer 150 of FIG. 2. The width W2 of the phase-change material layer 270 may be substantially same as the width of the phase-change material layer 170 of FIG. 2.

In the phase change memory device 300 of FIG. 23, a width W3 of a lower electrode layer 350 disposed in a first mold insulating layer 340 may be smaller than a width W4 of a phase-change material layer 370 disposed in a second mold insulating layer 360. For example, the width W3 of the lower electrode layer 350 may be substantially smaller than the width of the lower electrode layer 150 of FIG. 2. The width W4 of the phase-change material layer 370 may be substantially same as the width of the phase-change material layer 170 of FIG. 2. The width W3 of the lower electrode layer 350 may be substantially same as the width of the lower electrode layer 150 of FIG. 2. The width W4 of the phase-change material layer 370 may be substantially larger than the width of the phase-change material layer 170 of FIG. 2.

When the sacrificial layer 158 is formed with reference to FIG. 7, as described above, the protruding region 156 of the preliminary lower electrode layer 151 is oxidized and/or nitrified, and the sacrificial layer 158 includes a material having different physical/chemical characteristics from those of the preliminary lower electrode layer 151, and due to the difference between characteristics of the material, a volume of the sacrificial layer 158 with respect to the preliminary lower electrode layer 151 may be changed. Thus, a width of the sacrificial layer 158 may be larger or smaller than a width of the preliminary lower electrode layer 151. Thus, widths of the phase-change material layers 270 and 370 may be different from a width of the lower electrode layer 250, 350, e.g., may be smaller or larger than the width of the lower electrode layer 150, as discussed above in conjunction with FIGS. 22 and 23.

Figure 24:
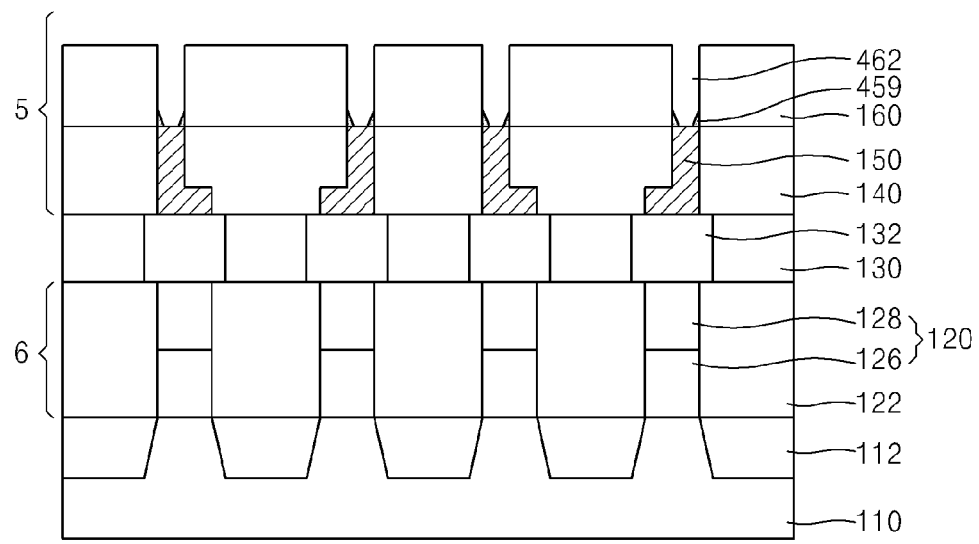
FIGS. 24 through 26 are schematic cross-sectional views illustrating a method of manufacturing a phase change memory device, according to example embodiments of inventive concepts.
Figure 25:
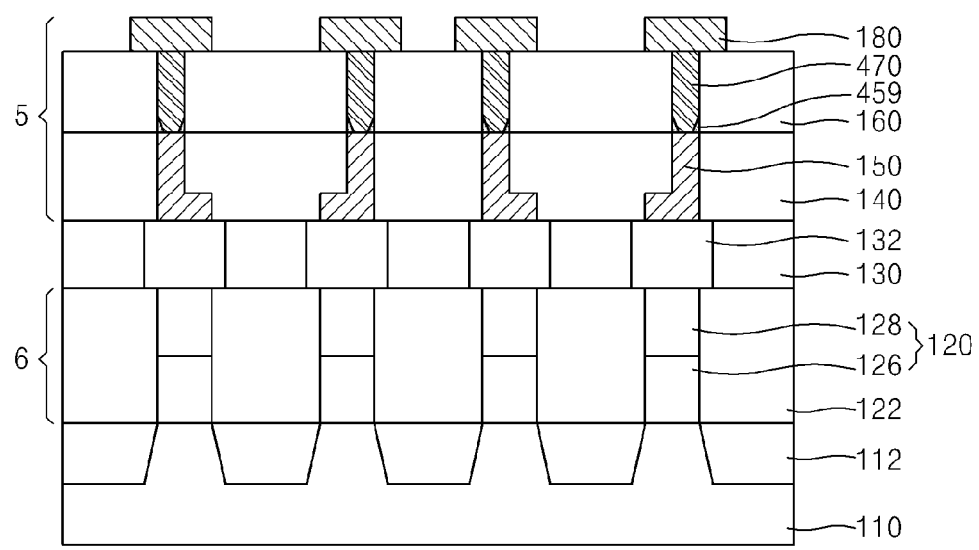
Figure 26:
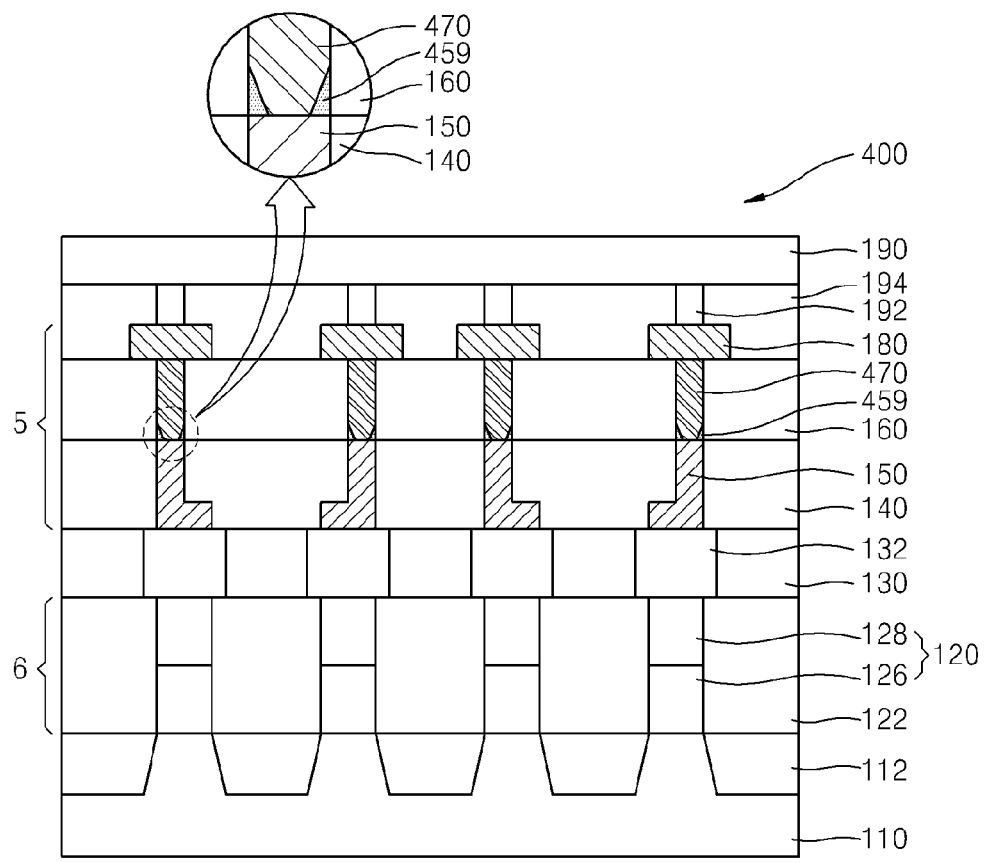

FIGS. 24 through 26 are schematic cross-sectional views illustrating a method of manufacturing a phase change memory device 400, according to example embodiments of inventive concepts.

The example embodiments of FIGS. 24 through 26 illustrate a residual sacrificial layer 459 remaining on an uppermost portion of a lower electrode layer 150 and a contact area between the lower electrode layer 150 and the phase-change material layer 470 is decreased, compared to the example embodiments of FIG. 2. A redundant description of features in common with the example embodiments of FIG. 2 will be omitted. It will be noted that, after the operations described in FIGS. 3 through 9 are performed, the operation of FIG. 24 is performed.

Referring to FIG. 24, after the operations described with reference to FIGS. 3 through 9 are performed, the sacrificial layer 158 of FIG. 7 is removed to form an opening 462 for exposing a portion of the lower electrode layer 150. A portion of the sacrificial layer 158 remains in the lower electrode layer 150 and form the residual sacrificial layer 459. The residual sacrificial layer 459 may be disposed on an exterior of a uppermost surface of the lower electrode layer 150. Thus, a central portion of the lower electrode layer 150 may be exposed. However, this is just an example, and example embodiments of inventive concepts are not limited thereto.

Referring to FIG. 25, the opening 462 is filled with a phase-change material to form a phase-change material layer 470.

Referring to FIG. 26, the phase change memory device 400 is manufactured by performing subsequent processes. The subsequent processes may include an operation of forming the upper electrode layer 180, the bitline contact plug 192, and the bitline 190. The upper electrode layer 180 and the bitline contact plug 192 may be surrounded by the third interlayer insulating layer 194.

In the phase change memory device 400 according to example embodiments, since the residual sacrificial layer 459 remains in a portion of the lower electrode layer 150, the phase-change material layer 470 may be physically and/or electrically connected to a portion of the uppermost surface of the lower electrode layer 150. In example embodiments, an area of a lowermost surface of the phase-change material layer 470 is smaller than an area of a uppermost surface of the lower electrode layer 150. Thus, a contact area between the phase-change material layer 470 and the lower electrode layer 150 may be decreased. Thus, the size of a current applied to the phase-change material layer 470, for example, the size of a reset current, may be decreased.

In addition, the example embodiments described with reference to FIGS. 13 through 21 may be combined with the lower electrode layer 150 and the phase-change material layer 470 of the phase change memory device 400 to define additional example embodiments of inventive concepts.

FIGS. 27 through 30 are schematic cross-sectional views illustrating a method of manufacturing a phase change memory device, according to example embodiments of inventive concepts. After performing the steps described in FIG. 3 through FIG. 6, the step shown in FIG. 27 may begin.

Figure 27:
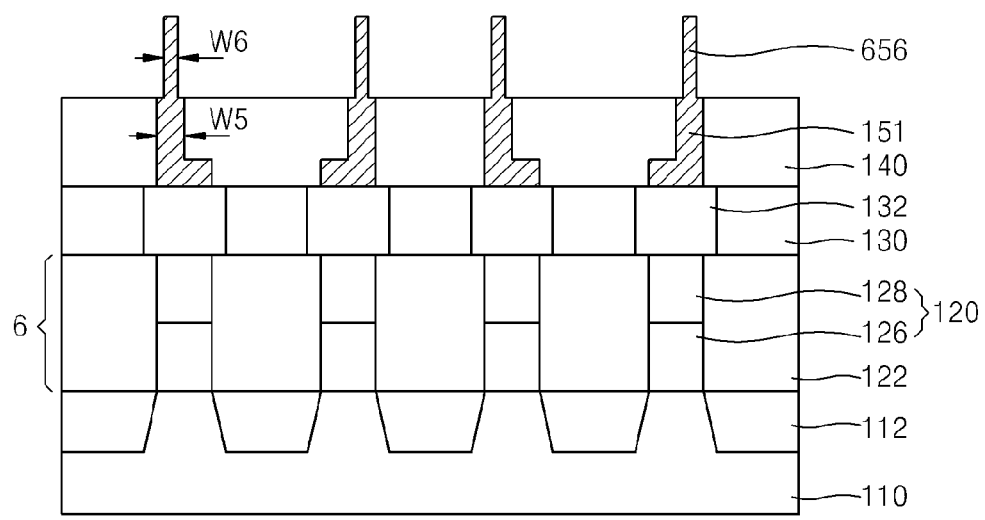
FIGS. 27 through 30 are schematic cross-sectional views illustrating a method of manufacturing a phase change memory device, according to example embodiments of inventive concepts.

Referring FIG. 27, the protruding region 156 of the preliminary lower electrode layer 151 disposed on the first mold insulating layer 140 shown in FIG. 6 is isotropically etched to form a protruding region 656. Accordingly, a width W6 of the protruding region 656 may be smaller than a width W5 of the preliminary lower electrode layer 151 buried in the first mold insulating layer 140.

Figure 28:
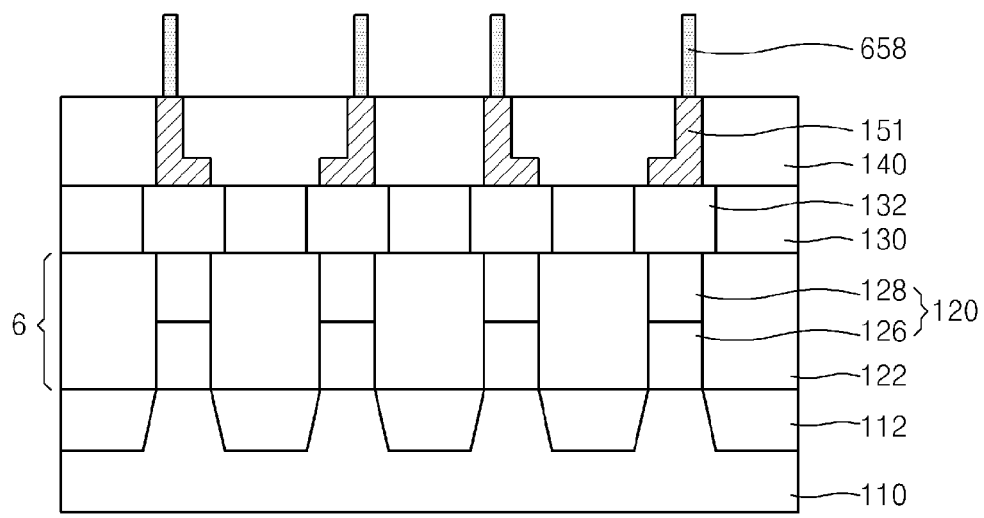

Referring FIG. 28, as described in FIG. 7, the protruding region 656 of the preliminary lower electrode layer 151 is treated to form a sacrificial layer 658. The treatment for the protruding region 656 may be an oxidation treatment or nitridation treatment and may be performed using plasma oxidation/nitridation, thermal oxidation/thermal nitridation, or ashing.

Alternatively, the protruding region 656 of the preliminary lower electrode layer 151 is treated and then isotropically etched to form the sacrificial layer 658. The treatment for the protruding region 656 may be oxidation treatment or nitridation treatment and may be performed using plasma oxidation/nitridation, thermal oxidation/thermal nitridation, or ashing.

Figure 29:
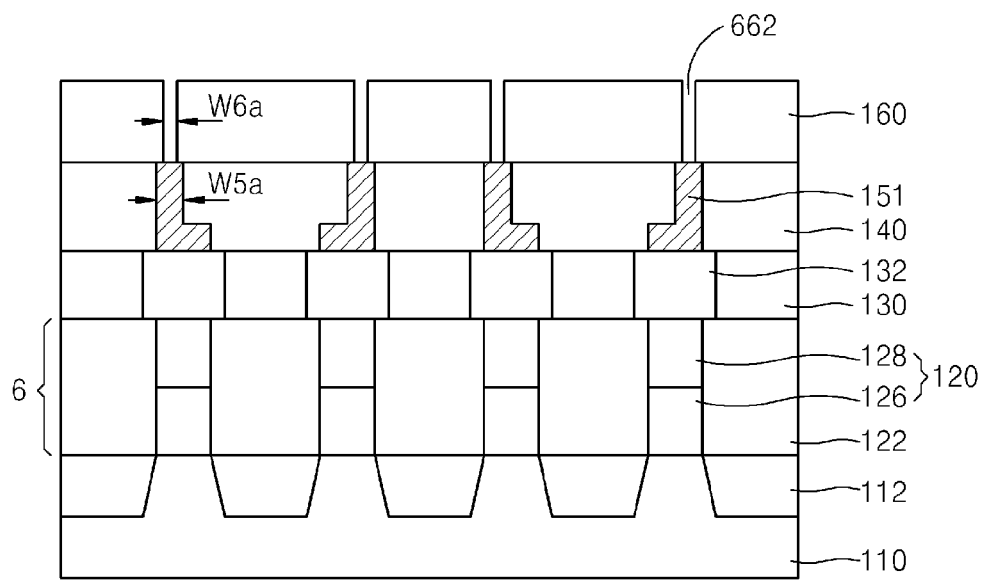

Referring FIG. 29, as described in FIG. 8, a second mold insulating layer 160 is formed on the first mold insulating layer 140 to surround and cover the sacrificial layer 658. Then, as described in FIG. 9, the second mold insulating layer 160 is planarized to expose an uppermost surface of the sacrificial layer 658. Then, as described in FIG. 10, the sacrificial layer 658 is removed to form an opening 662 for exposing the lower electrode layer 151. A width W6a of the opening 662 may correspond to the width W6 of the protruding region 656. A width W5a of the lower electrode layer 151 may correspond to the width W5 of the preliminary lower electrode layer 150. Accordingly, the width W6a of the opening 662 may be smaller than the width W5a of the lower electrode layer 151.

Figure 30:
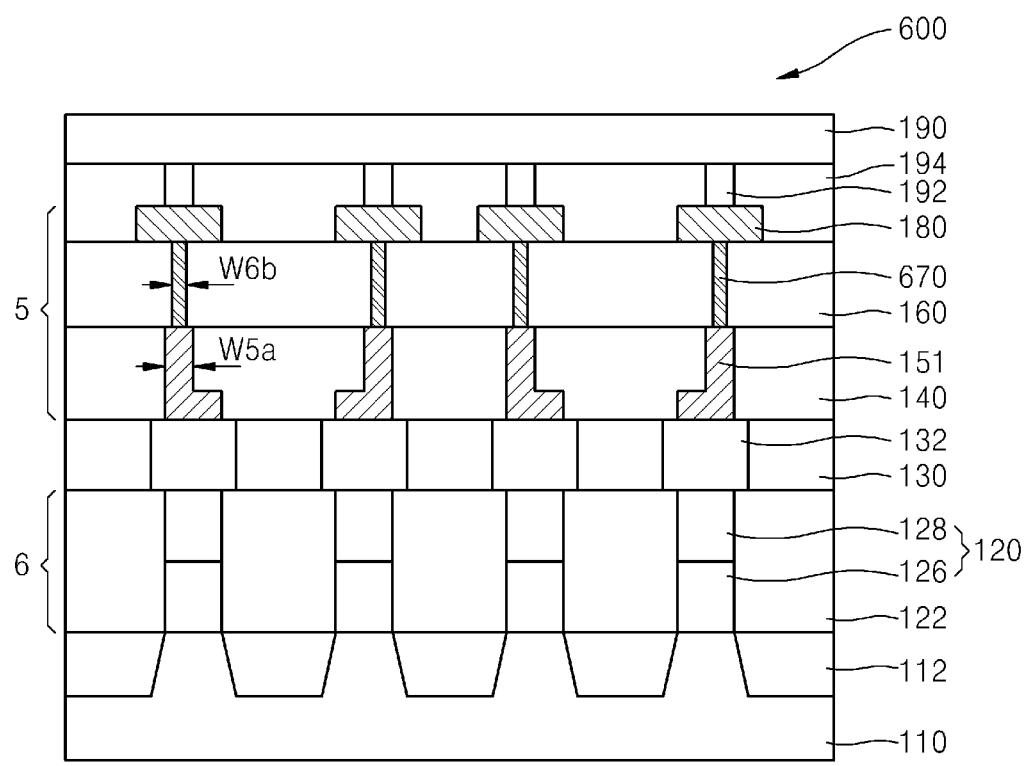

Referring FIG. 30, as described in FIG. 11, the opening 662 is filled with a phase-change material to form a phase-change material layer 670. A width W6b of the phase-change material layer 670 may correspond to the width W6a of the opening 662. Accordingly, the width W6b of the phase-change material layer 670 may be smaller than the width W5a of the lower electrode layer 151. Then, as described in FIG. 12, the upper electrode layer 180 is formed on the phase-change material layer 670. Then, as described in FIG. 2, the bitline contact plug 192 physically and/or electrically connected to the upper electrode layer 180 is formed. Then, the bitline 190 physically and/or electrically connected to the bitline contact plug 192 is formed. Therefore, the phase change memory device 600 is completed.

In the phase change memory device 600, since the width W6b of the phase-change material layer 670 is smaller than the width W5a of the lower electrode layer 151, a contact area of the phase-change material layer 670 contacting the lower electrode layer becomes smaller. Thus, a current density per contact area of the phase-change material layer 670 can be increased, thereby providing a memory device which can be driven under a lower current density.

Figure 31A:
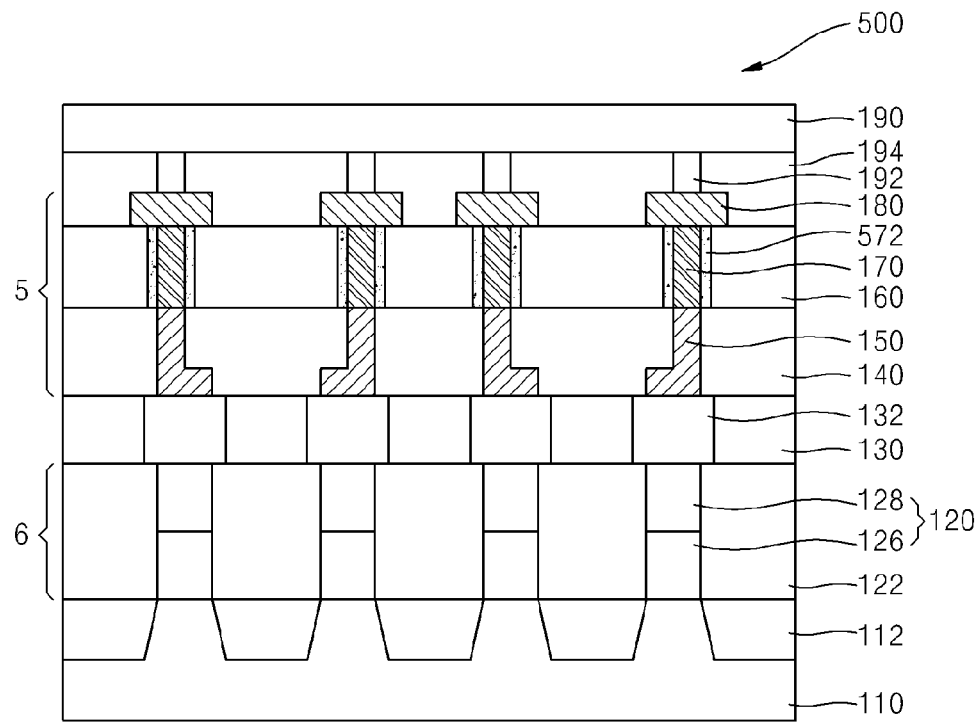
FIGS. 31A and 31B are schematic cross-sectional views of a phase change memory device according to example embodiments of inventive concepts.
Figure 31B:
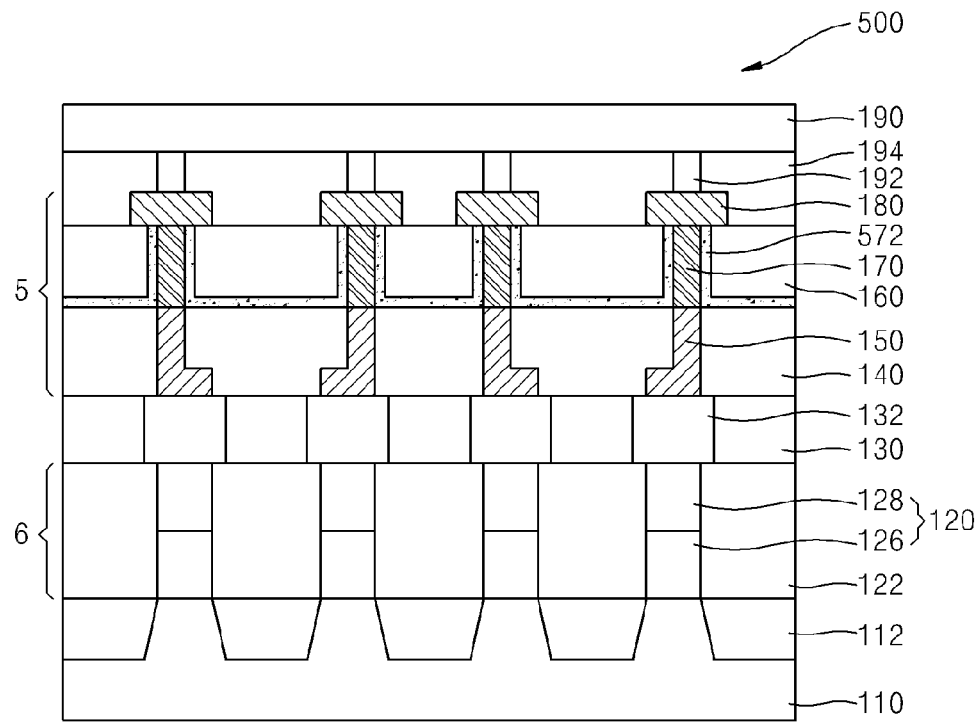

FIGS. 31A and 31B are schematic cross-sectional views of a phase change memory device 500 according to example embodiments of inventive concepts. Example embodiments of FIG. 31A further include a thermal prevention layer 572 surrounding the phase-change material layer 170, compared to example embodiments of FIG. 2. A redundant description of the elements in common with example embodiments of FIG. 2 will be omitted. Example embodiments of FIG. 31B further include the thermal prevention layer 572 surrounding the phase-change material layer 170 and the second mold insulating layer 160, compared to example embodiments of FIG. 31A.

Referring to FIGS. 31A and 31B, the phase change memory device 500 includes the thermal prevention layer 572 surrounding the phase-change material layer 170 and/or the second mold insulating layer 160. The thermal prevention layer 572 may include a material having low heat transfer properties through electrons and/or phonons. The thermal prevention layer 572 may have a lower coefficient of heat transfer than the second mold insulating layer 160. The thermal prevention layer 572 may include an insulating material.

The thermal prevention layer 572 may have a multi-layered structure. The multi-layered structure may include silicon nitride, silicon oxynitride, silicon carbide, silicon oxide, aluminum oxide, aluminum nitride, hafnium oxide, zirconium oxide, titanium oxide, nickel oxide, and a combination thereof. The thermal prevention layer 572 may reduce or prevent heat transfer from the phase-change material layer 170 and/or the second mold insulating layer 160 to the exterior thereof, thereby providing a more reliable phase change in the phase-change material layer 170 due to the heat generated by the applied current. In addition, the thermal prevention layer 572 may serve as an obstacle to the heat transfer between adjacent cells, and thus an operation failure due to the heat interference between cells may be reduced.

As shown in FIGS. 31A and 31B, an insulation layer or layers may be provided on the sidewalls of the phase-change material layer 170 which may reduce or prevent heat transfer from the phase-change material layer 170 to the exterior thereof, thereby providing a more reliable phase change in the phase-change material layer 170 due to the heat generated by the applied current. In addition, the features of FIGS. 31A and 31B may also be applied to the example embodiments shown in FIGS. 22, 23, 26, and 30.

Figure 32:
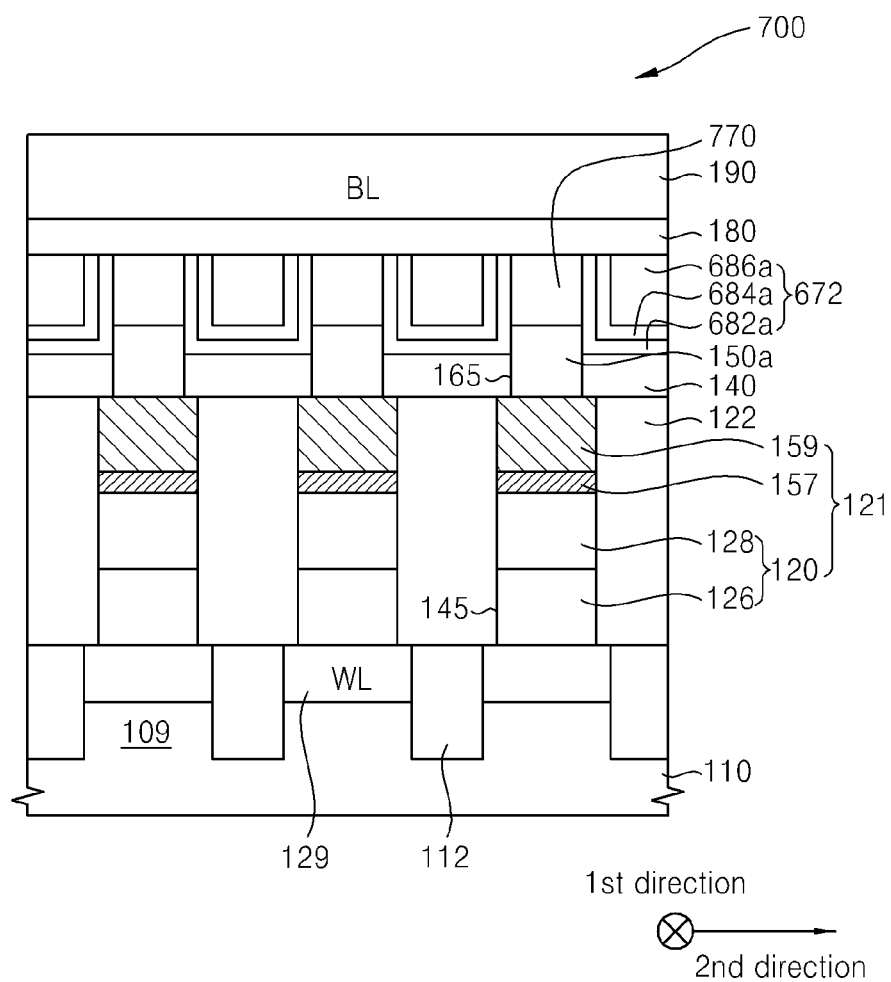
FIG. 32 is a cross-sectional view illustrating a phase change memory device in accordance with example embodiments of inventive concepts.
Figure 33:
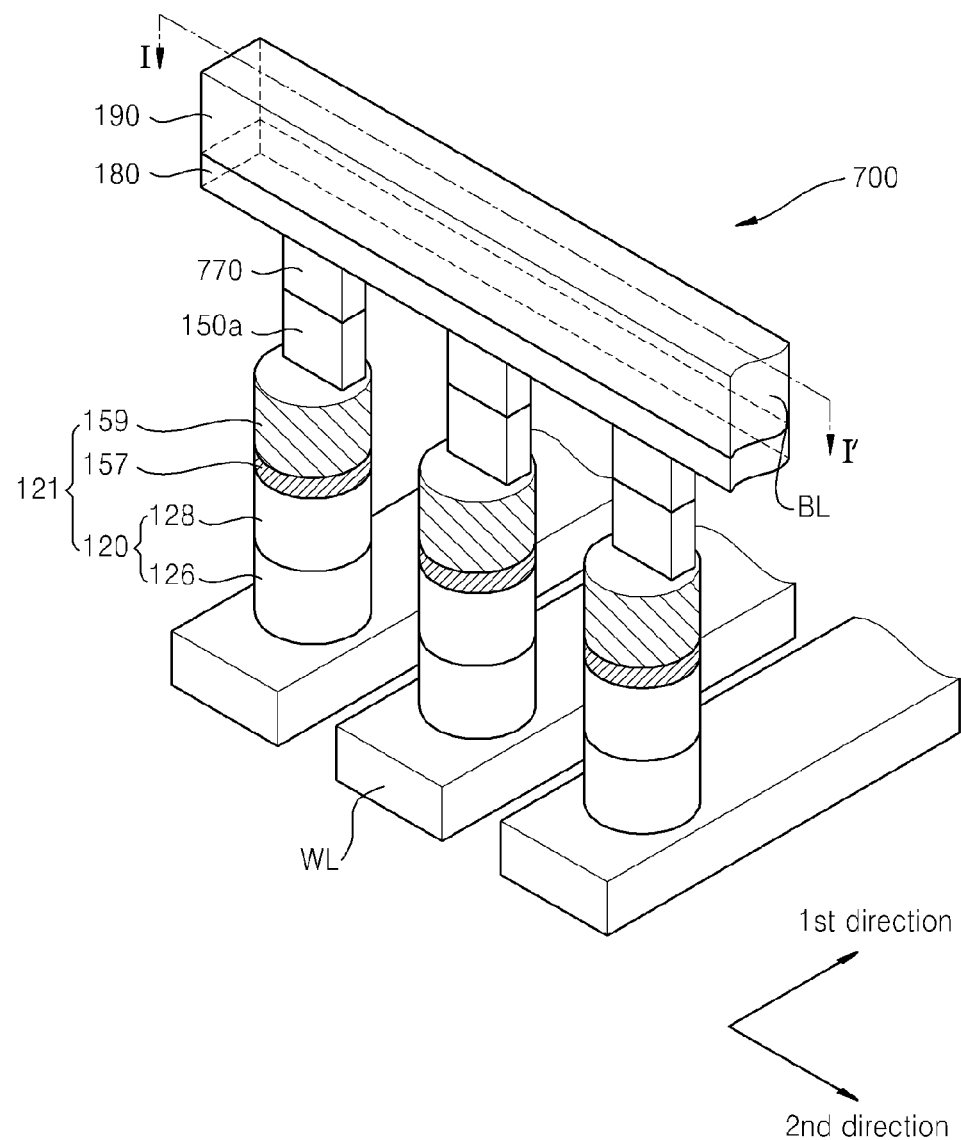
FIG. 33 is a perspective view illustrating a cell array of the phase change memory device of FIG. 32.

FIG. 32 is a cross-sectional view illustrating a phase change memory device 700 in accordance with example embodiments of inventive concepts, and FIG. 33 is a perspective view illustrating a cell array of the phase change memory device 700 of FIG. 32. For convenience of explanation, redundant parts of the phase change memory device 700 are omitted in FIG. 33, and FIG. 32 is a cross-sectional view cut along the line I-I' of FIG. 33.

Referring to FIGS. 32 and 33, the phase change memory device 700 may include a contact structure 121, a lower electrode layer 150a, a phase-change material layer 770 and an upper electrode layer 180 sequentially stacked on a substrate 110, and an insulation layer structure 672 including a first thin film pattern 682a, a second thin film pattern 684a and a filling layer pattern 686a sequentially stacked on sidewalls of the lower electrode layer 150a and the phase-change material layer 770. Additionally, the phase change memory device 700 may include a bitline 190 electrically connected to the upper electrode layer 180 and a word line 129 electrically connected to the contact structure 121. Furthermore, the phase change memory device 700 may include a first interlayer insulating layer 122 surrounding the contact structure 121 and a mold insulating layer 140 surrounding a lower portion of the lower electrode layer 150a.

The substrate 110 may include a semiconductor substrate, e.g., a silicon substrate, a germanium substrate or a silicon-germanium substrate, a silicon-on-insulator (SOI) substrate, a germanium-on-insulator (GOI) substrate, and the like. The substrate 110 may be divided into an active region 109 and a field region of a device isolation layer 112. In example embodiments, a plurality of device isolation layers 112 may be formed to define a plurality of active regions 109 on the substrate 110, and each device isolation layer 112 may extend in a first direction substantially perpendicular to the second direction.

In example embodiments, a plurality of active regions 109 may be formed respectively between a device isolation layer 112 and the adjacent active isolation layer 112, and each active region 109 may extend in the first direction. Each active region 109 may include the word line 129. Thus, a plurality of word lines 129 may be formed in the active region 109, and each word line 129 may extend in the first direction. The word line 129 may include impurities having a different conduction type from that of the substrate 110. For example, when the substrate 110 is a p-type silicon substrate 110, the word line 129 may include n-type impurities. Alternatively, the word line 129 may include a metal.

The first interlayer insulating layer 122 may be formed on the substrate 110 and the device isolation layers 112. The first interlayer insulating layer 122 may include a silicon oxide such as undoped silicate glass (USG), spin on glass (SOG), borophosphosilicate glass (BPSG), tonen silazene (TOSZ), flowable oxide (FOX), plasma-enhanced tetraethyl orthosilicate (PE-TEOS), high density plasma chemical vapor deposition (HDP-CVD) oxide or other similar material.

A plurality of first openings 145 exposing the word lines 129 may be formed through the first interlayer insulating layer 122. The first openings 145 having an island shape may be formed along the first direction on each word line 129, thereby to be formed in the form of matrix along the first direction and the second direction. In example embodiments, each first opening 145 may have a circular or elliptical shape from a top view.

Each contact structure 121 may fill each first opening 145, and may include a diode 120, an ohmic contact layer 157, and a contact plug 159 sequentially stacked on the word line 129.

The diode 120 may include a layer 126 of first conductivity type and a layer 128 of second conductivity type sequentially stacked on the word line 129. The first and second conductive layers 126 and 128 may include polysilicon doped with impurities having different conductivity types from each other. The first and second conductive layers 126 and 128 may be epitaxial layers. In example embodiments, a plurality of diodes 120 may be formed in the first openings 145, respectively, and each diode 120 may have a cylindrical pillar shape.

The ohmic contact layer 157 may be formed on the diode 120. The ohmic contact layer 157 may include a metal silicide such as cobalt silicide, tungsten silicide, etc.

The contact plug 159 may fill the remaining portion of the first opening 145 on the ohmic contact layer 157. The contact plug 159 may include a metal, e.g. tungsten. Each of the ohmic contact layer 157 and the contact plug 159 may have a cylindrical pillar shape. In example embodiments, a plurality of ohmic contact layers 157 and a plurality of contact plugs 159 may be formed in both of the first and second directions.

The mold insulating layer 140 may be formed on the first interlayer insulating layer 122 and the contact plugs 159. The mold insulating layer 140 may include silicon oxide like the first interlayer insulating layer 122. Alternatively, the mold insulating layer 140 may include silicon nitride or silicon oxynitride.

A plurality of second openings 165 partially exposing top surfaces of the contact plugs 159 may be formed through the mold insulating layer 140. The second openings 165 may have an island shape, and be formed in both of the first and second directions.

Each lower electrode layer 150a may fill a lower portion of each second opening 165 on the exposed top surface of each contact plug 159. The lower electrode layer 150a may protrude from a top surface of the mold insulating layer 140. The lower electrode layer 150a may include a metal or a metallic compound, e.g., titanium, titanium carbide, titanium nitride, titanium carbon nitride, titanium oxynitride, titanium silicon nitride, tantalum, tantalum carbide, titanium nitride, tantalum carbon nitride, tantalum oxynitride, tantalum silicon nitride, tungsten, tungsten nitride, tungsten carbon nitride, tungsten oxynitride, tungsten silicon nitride, or other similar material. The lower electrode layer 150a may have an island shape, and be formed in both of the first and second directions. In example embodiments, each lower electrode layer 150a may have an "I" shape or an "L" shape from a top view.

Each phase-change material layer 770 may be formed on each lower electrode layer 150a. The phase-change material layer 770 may include a chalcogenide, e.g., GeTe, SbTe, GeSbTe, GeTeAs, SnTeSn, SeTeSn, GeTeSe, SbSeBi, GeBiTe, GeTeTi, InSe, GaTeSe, InSbTe, etc. The phase-change material layers 770 may have an island shape, and be formed in both of the first and second directions. In example embodiments, each phase-change material layer 770 may have an "I" shape or an "L" shape from a top view like the lower electrode layer 150a.

The insulation layer structure 672 may surround the phase-change material layers 770 and upper portions of the lower electrode layers 150a on the mold insulating layer 140. The insulation layer structure 672 may have a top surface coplanar with that of the phase-change material layers 770.

The insulation layer structure 672 may include a plurality of thin film patterns and a filling layer pattern 686a. The thin film patterns may be formed on the sidewalls of the phase-change material layers 770 and the upper portions of the lower electrode layers 150a and on the mold insulating layer 140. The thin film patterns may include materials having different thermal conductivities from one another. In example embodiments, two different thin film patterns, e.g., the first and second thin film patterns 682a and 684a may be formed.

The first thin film pattern 682a may be conformally formed on sidewalls of the protruded upper portions of the lower electrode layers 150a, the sidewalls of the phase-change material layers 770 and a top surface of the mold insulating layer 140. The second thin film pattern 684a may be conformally formed on the first thin film pattern 682a. Thus, the first and second thin film patterns 682a and 684a may surround the sidewalls of the phase-change material layers 770 and the sidewalls of the protruded upper portions of the lower electrode layers 150a having island shapes.

The filling layer pattern 686a may be formed on the second thin film pattern 684a and have a top surface coplanar with that of the phase-change material layers 770.

The first and second thin film patterns 682a and 684a may include materials having different thermal conductivities from each other. For example, the first and second thin film patterns 682a and 684a may include an oxide and a non-oxide material such as silicon carbide, aluminum nitride, etc., having a relatively higher thermal conductivity, respectively.

The first and second thin film patterns 682a and 684a and the filling layer pattern 686a may include silicon nitride, silicon oxynitride, silicon carbide, silicon oxide, aluminum oxide, aluminum nitride, hafnium oxide, zirconium oxide, titanium oxide, nickel oxide, or other similar material.

In an example embodiment, the first thin film pattern 682a and the filling layer pattern 686a may include substantially the same material, and the second thin film pattern 684a may include a different material therefrom. Alternatively, the first and second thin film patterns 682a and 684a and the filling layer pattern 686a may include different materials from one another. In an example embodiment, the first thin film pattern 682a and the filling layer pattern 686a may include silicon nitride, and the second thin film pattern 684a may include silicon oxide.

As illustrated above, the insulation layer structure 672 may include a plurality of thin film patterns surrounding the phase-change material layers 770 and the upper portions of the lower electrode layers 150a, and a thermal boundary resistance (TBR) may occur at interfaces therebetween. Thus, the thermal conductivity in the insulation layer structure 672 may be remarkably decreased so that a heat transfer between adjacent cells including the phase-change material layers 770 may be reduced. As the number of the thin film patterns increases, the thermal conductivity may be decreased.

The phase change memory device 700 may have the insulation layer structure 672 serving as an obstacle to the heat transfer between adjacent cells, and thus an operation failure due to the heat interference between cells may be reduced.

In FIG. 32, the insulation layer structure 672 has two thin film patterns, however, the insulation layer structure 672 may have more thin film patterns. In an example embodiment, the insulation layer structure 672 may have a silicon nitride layer and a silicon oxide layer alternately and repeatedly stacked on each other.

The upper electrode layer 180 may be formed on the phase-change material layers 770 and the insulation layer structure 672. In example embodiments, a plurality of upper electrodes layers 180 may be formed in the first direction, and each upper electrode layer 180 may extend in the second direction. The upper electrode layer 180 may include a metal or a metallic compound, e.g., titanium, titanium carbide, titanium nitride, titanium carbon nitride, titanium oxynitride, titanium silicon nitride, tantalum, tantalum carbide, titanium nitride, tantalum carbon nitride, tantalum oxynitride, tantalum silicon nitride, tungsten, tungsten nitride, tungsten carbon nitride, tungsten oxynitride, tungsten silicon nitride, or other similar material. In example embodiments, the upper electrode layer 180 may include a material substantially the same as that of the lower electrode layer 150a. Alternatively, the upper electrode layer 180 may include a material different from that of the lower electrode layer 150a.

The bitline 190 may extend in the second direction on the upper electrode layer 180. The bitline 190 may include a metal, e.g., copper or tungsten. When the bitline 190 include copper, the bitline 190 may further include a barrier layer (not shown). The barrier layer may include, e.g., titanium, titanium nitride, tantalum nitride, titanium silicide, or other similar material.

In example embodiments, the bitline 190 may have a width substantially the same as that of the upper electrode layer 180.

The phase change memory device 700 may have the insulation layer structure 672 including a plurality of thin film patterns and surrounding the phase-change material layers 770, and thus a heat transfer between adjacent cells may be reduced. Thus, the phase change memory device 700 may have reduced operation failure due to the heat interference.

Figure 37:
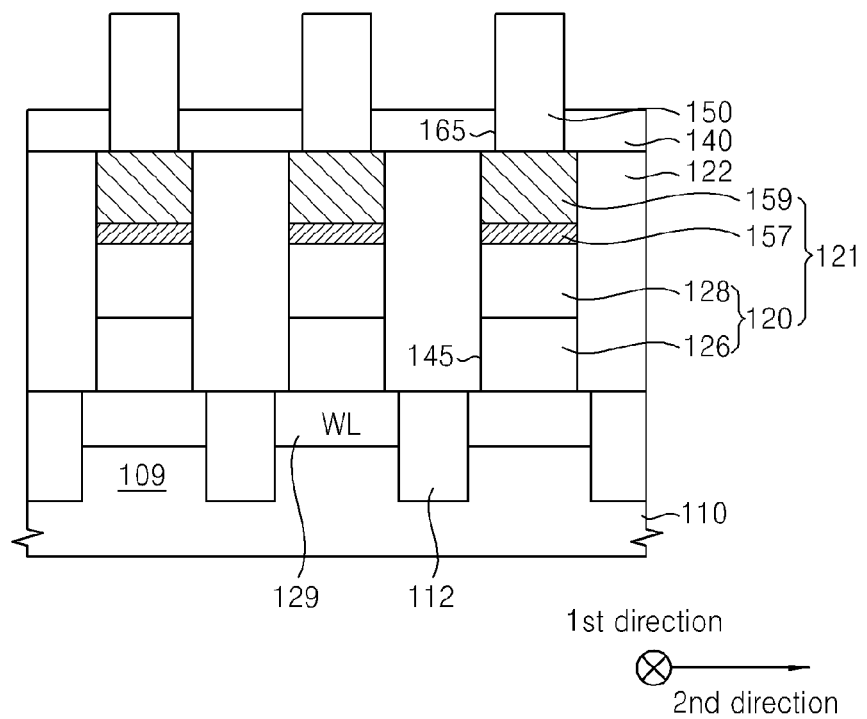
Figure 38:
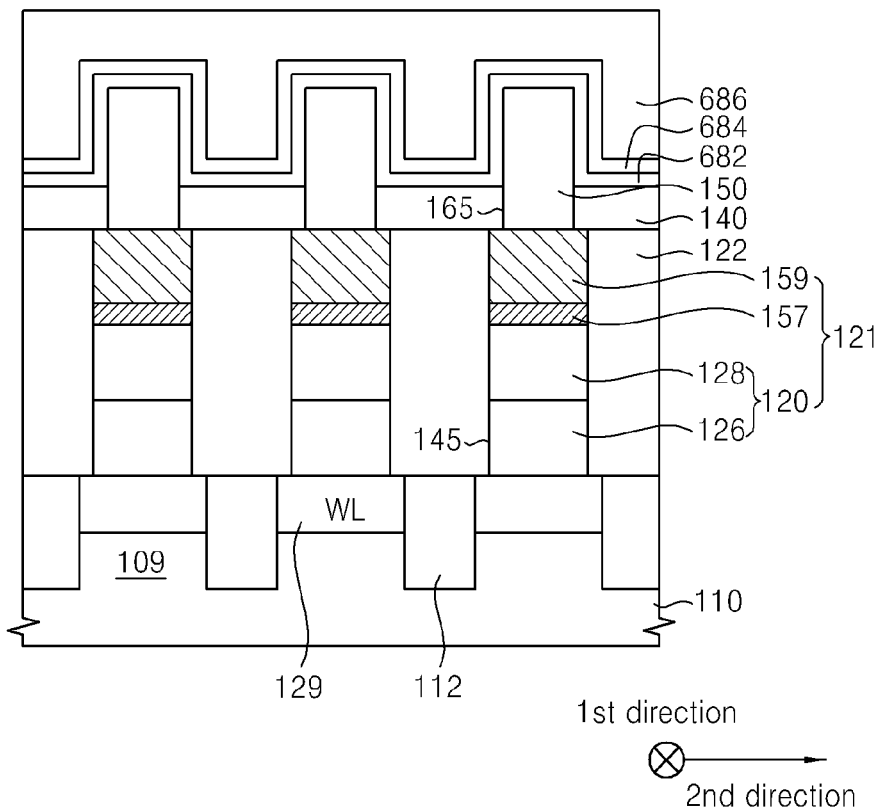
Figure 39:
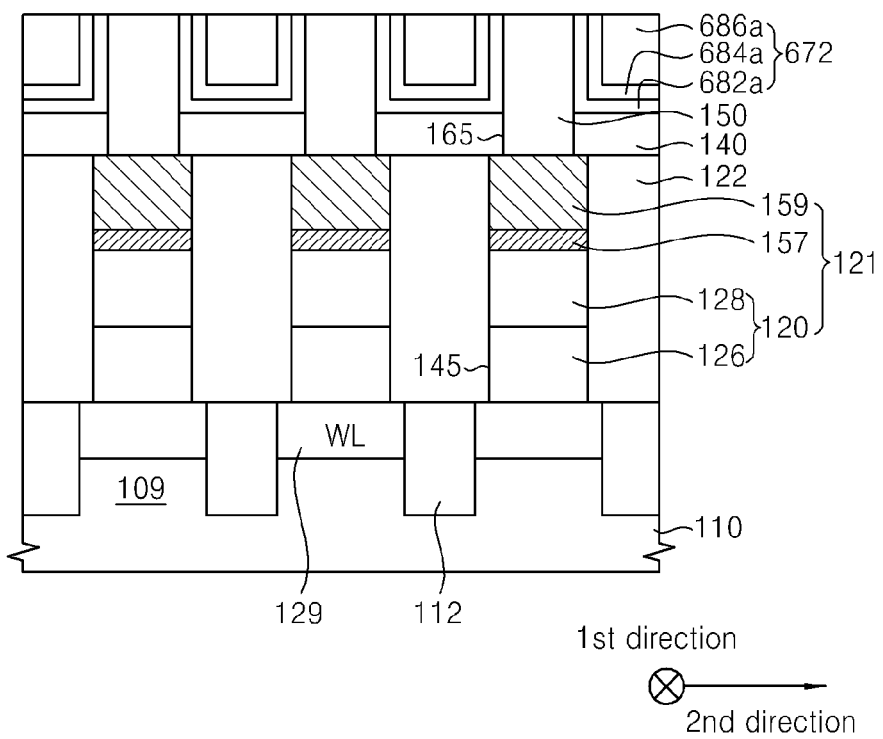
Figure 40:
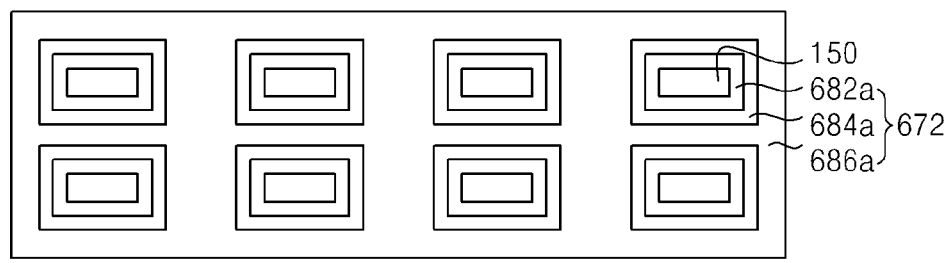
FIG. 40 is a plan view of the phase change memory device of FIG. 39.

FIGS. 34 to 39 and 41 to 43 are cross-sectional views illustrating a method of manufacturing the phase change memory device 700 of FIG. 32 and FIG. 40 is a plan view of the phase change memory device 700 of FIG. 39. FIGS. 34 to 39 and 41 to 43 are cross-sectional views cut along the line I-I' of FIG. 33.

Figure 34:
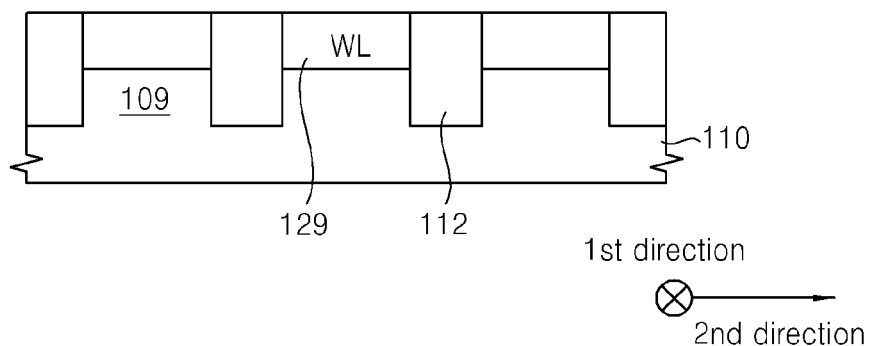
FIGS. 34 to 39 and 41 to 43 are cross-sectional views illustrating a method of manufacturing the phase change memory device of FIG. 32.

Referring to FIG. 34, device isolation layers 112 defining active regions 109 may be formed on a substrate 110, and a plurality of word lines 129 may be formed at upper portions of the active regions 109, respectively.

The substrate 110 may include a semiconductor substrate, e.g., a silicon substrate, a germanium substrate or a silicon-germanium substrate, an SOI substrate, a GOI substrate, or other similar structure. In example embodiments, the substrate 110 may be a silicon substrate doped with p-type impurities. The device isolation layers 112 may be formed by a shallow trench isolation (STI) process. In example embodiments, the device isolation layers 112 may be formed to define the active regions 109 therebetween, and each device isolation layer 112 may be formed to extend in a first direction substantially perpendicular to the second direction. Thus, the active regions 109 may be formed between the device isolation layer 112 and the adjacent device isolation layer 112, and each active region 109 may extend in the first direction.

Impurities are implanted into the upper portions of the active regions 109 to form the word lines 129. Thus, each word line 129 may be formed to extend in the first direction in which the active region 109 extends. In an example embodiment, the word lines 129 may be formed by implanting n-type impurities when the substrate 110 is a silicon substrate doped with p-type impurities. Alternatively, the word lines 129 may be formed using a metal.

Figure 35:
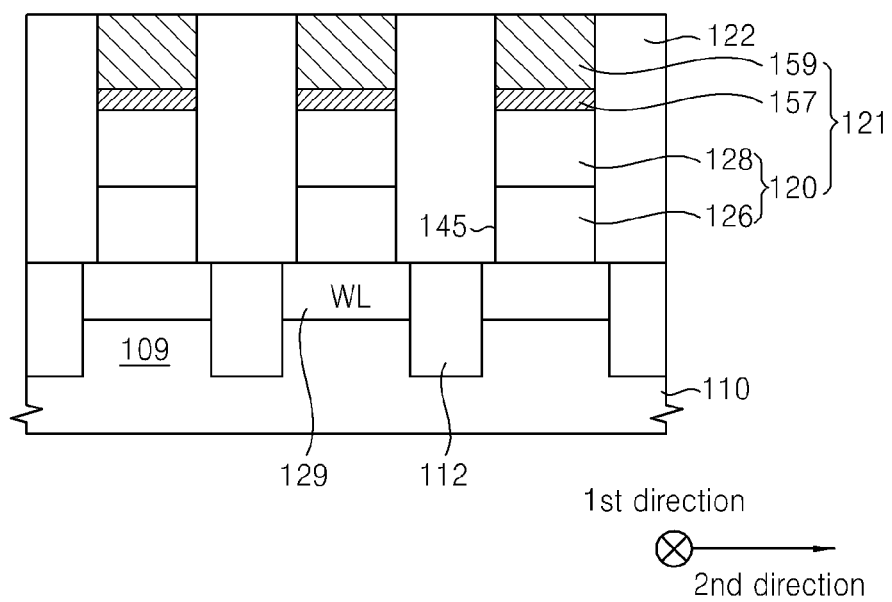

Referring to FIG. 35, a first interlayer insulating layer 122 may be formed on the substrate 110, and a plurality of first openings 145 exposing the word lines 129 may be formed through the first interlayer insulating layer 122.

The first interlayer insulating layer 122 may be formed using a silicon oxide such as USG, (SOG, BPSG, TOSZ, FOX, (PE-TEOS, HDP-CVD oxide, or other similar material. In example embodiments, a first mold layer may be formed on the substrate 110 by a chemical vapor deposition (CVD) process, and the first mold layer may be partially removed by an etching process to form the first interlayer insulating layer 122 having the first openings 145 therethrough. In example embodiments, a plurality of first openings 145 having an island shape may be formed in the first direction on each word line 129.

A contact structure 121 may be formed on each first opening 145. The contact structure 121 may be formed by sequentially forming a layer 126 of first conductivity type, a layer 128 of second conductivity type, an ohmic contact layer 157 and a contact plug 159 in each first opening 145 on the word line 129.

The first and second conductive layers 126 and 128 defining a diode 120 may be formed using polysilicon having different conduction types from each other. In example embodiments, the first and second conductive layers 126 and 128 may be formed using polysilicon doped with n-type impurities and p-type impurities, respectively. For example, a conductive layer may be grown in the first openings 145 using exposed top surfaces of the word lines 129 as a seed layer, and different types of impurities may be implanted into lower and upper portions of the conductive layer, respectively, to form the diode 120. In an example embodiment, the conductive layer may be grown by a selective epitaxial growth (SEG) process. Alternatively, the conductive layer may be formed by a solid phase epitaxial (SPE) process.

The ohmic contact layer 157 may be formed by forming a metal layer on the diode 120 in the first opening 145 and heat treating the metal layer. In example embodiments, the metal layer may be formed using cobalt, tungsten, etc., and the heat treatment may be performed at a temperature of about 800 to about 900° C., and thus the ohmic contact layer 157 may be a cobalt silicide layer or a tungsten silicide layer.

The contact plug 159 may be formed by forming a metal layer, e.g., a tungsten layer on the ohmic contact layer 157 in the first opening 145 and by planarizing an upper portion of the metal layer. In example embodiments, the planarization may be performed by a chemical mechanical polishing (CMP) process and/or an etch back process.

Figure 36:
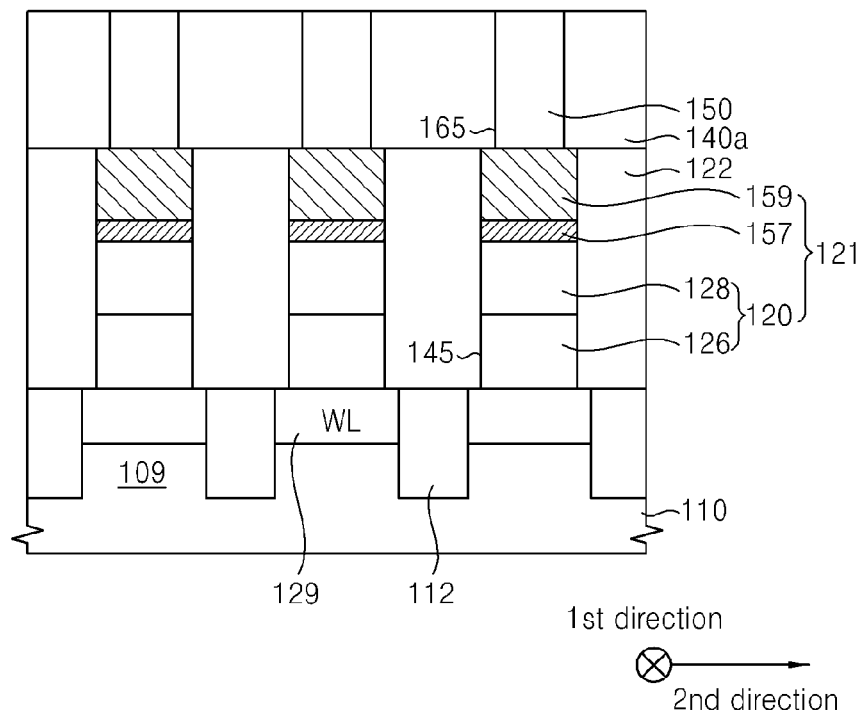

Referring to FIG. 36, a mold insulating layer 140 may be formed on the first interlayer insulating layer 122 and the contact plugs 159, and the mold insulating layer 140 may be partially removed to form a preliminary mold layer pattern 140a having a plurality of second openings 165 partially exposing the contact plugs 159. The plurality of second openings 165 may be formed in the island shape in both of the first and second directions and each second opening 165 may expose only the top surface of the corresponding contact plug 159, respectively. Alternatively, each second opening 165 may expose not only top surfaces of adjacent contact plugs 159 (for example, two adjacent contact plugs 159) in the first direction but also a top surface of the first interlayer insulating layer 122 between the adjacent contact plugs 159.

The preliminary mold layer pattern 140a may be formed using a material substantially the same as that of the first interlayer insulating layer 122. Alternatively, the preliminary mold layer pattern 140a may be formed using silicon nitride, silicon oxynitride, etc.

A lower electrode layer may be formed on inner walls of the second openings 165, the exposed top surfaces of the contact plugs 159, the exposed top surface of the first interlayer insulating layer 122 and a top surface of the preliminary mold layer pattern 140a, and the lower electrode layer may be partially removed by e.g., an anisotropic etching process to form a plurality of preliminary lower electrodes 150 on the inner walls of the second openings 165. The lower electrode layer may be formed by a CVD process, a plasma enhanced chemical vapor deposition (PECVD) process, an atomic layer deposition (ALD) process, a pulse laser deposition (PLD) process, a sputtering process, or other similar process. In example embodiments, the lower electrode layer may be formed using a material that is not reacted with a phase-change material layer 770 (refer to FIG. 42) subsequently formed. For example, the lower electrode layer may be formed using titanium carbide (TiC), tantalum carbide (TaC), titanium nitride (TiN), tantalum nitride (TaN), tungsten nitride (WN), titanium carbon nitride (TiCN), titanium silicon nitride (TiSiN), tantalum silicon nitride (TaSiN), or other similar material.

Each preliminary lower electrode 150 may be formed to have an "I" shape or an "L" shape from a top view having a narrow width.

An insulating material may be filled into the remaining portions of the second openings 165, and an upper portion of the insulating material may be planarized until a top surface of the preliminary mold layer pattern 140a is exposed. In example embodiments, the insulating material may be substantially the same as that of the preliminary mold layer pattern 140a. Portions of the preliminary lower electrode 150 extending in the first direction may be removed to form a plurality lower electrodes 150 remaining on the contact structure 121, respectively, and spaces generated from the removal of the portions of the preliminary lower electrode 150 may be filled with an insulating material. The insulating material may be substantially the same as that of the preliminary mold layer pattern 140a, and thus the insulating material may be merged into the preliminary mold layer pattern 140a to surround the preliminary lower electrodes 150.

Referring to FIG. 37, an upper portion of the preliminary mold layer pattern 140a may be removed by a wet etching process. The wet etching process may be performed using a solution including HF, $H_3PO_4$ and deionized water. Thus, the preliminary mold layer pattern 140a may be transformed to a mold insulating layer 140 surrounding lower sidewalls of the preliminary lower electrodes 150. Upper sidewalls of the preliminary lower electrodes 150 may be exposed by the preliminary mold layer pattern 140a.

Referring to FIG. 37, the preliminary lower electrodes 150 are treated. The treatment may be an oxidation treatment or nitridation treatment and may be performed using plasma oxidation/nitridation, thermal oxidation/thermal nitridation, or ashing.

Referring to FIG. 38, a plurality of thin films may be sequentially stacked on the preliminary lower electrodes 150 and the mold insulating layer 140. In example embodiments, first and second thin films 682 and 684 are formed.

The first and second thin films 682 and 684 may be formed using materials having different thermal conductivities from each other. The materials of the first and second thin films 682 and 684 may not be limited to specific materials if only the materials are insulating materials.

For example, the first and second thin films 682 and 684 are silicon nitride, silicon oxynitride, silicon carbide, silicon oxide, aluminum oxide, aluminum nitride, hafnium oxide, zirconium oxide, titanium oxide, nickel oxide, or other similar material. In example embodiments, the first thin film 682 may be a silicon oxide layer, and the second thin film 684 may be a silicon nitride layer.

A filling layer 686 may be formed on the second thin film 684 to sufficiently fill a space between the preliminary lower electrodes 150.

In example embodiments, the filling layer 686 may be formed using silicon nitride, silicon oxynitride, silicon carbide, silicon oxide, aluminum oxide, aluminum nitride, hafnium oxide, zirconium oxide, titanium oxide, nickel oxide, or other similar material. In an example embodiment, the filling layer 686 may be formed using a material substantially the same as that of the first thin film 682 and different from that of the second thin film 684.

When the first thin film 682 is a silicon oxide layer and the second thin film 684 is a silicon nitride layer, the filling layer 686 may be a silicon oxide layer. Alternatively, the first and second thin films 682 and 684 and the filling layer 686 may be formed using different materials from one another.

In example embodiments, more thin films may be formed to increase the effect that the heat transfer between cells may be prevented. In example embodiments, a third thin film (not shown) including silicon oxide or silicon oxynitride may be further formed on the second thin film 684 including silicon nitride.

Referring to FIGS. 39 and 40, the filling layer 686, the second thin film 684 and the first thin film 682 may be planarized until a top surface of the preliminary lower electrodes 150 is exposed. The planarization may be performed by a CMP process and/or an etch back process. Thus, the insulation layer structure 672 including a first thin film pattern 682a, a second thin film pattern 684a and a filling layer pattern 686a sequentially stacked on the mold insulating layer 140. The insulation layer structure 672 may prevent the heat transfer between the preliminary lower electrodes 150.

Figure 41:
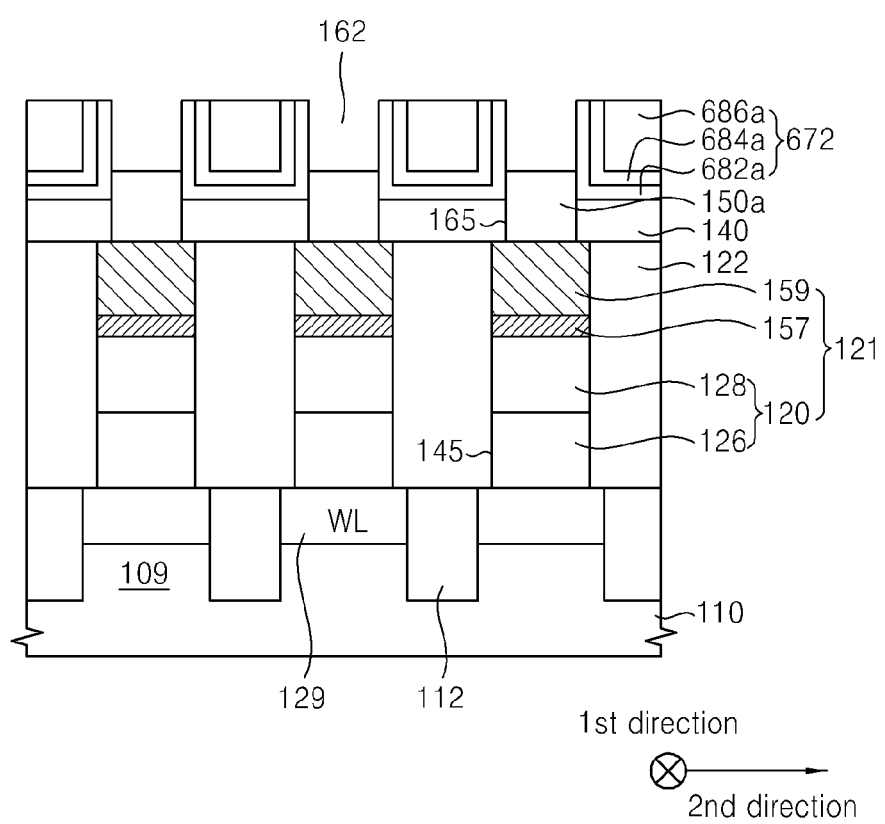

Referring to FIG. 41, upper portions of the preliminary lower electrodes 150 may be removed by a wet etching process to form openings 162. Thus, the preliminary lower electrode 150 may be transformed into a lower electrode layer 150a having a top surface higher than that of the mold insulating layer 140. The wet etching process may be performed using SC1 solution.

Figure 42:
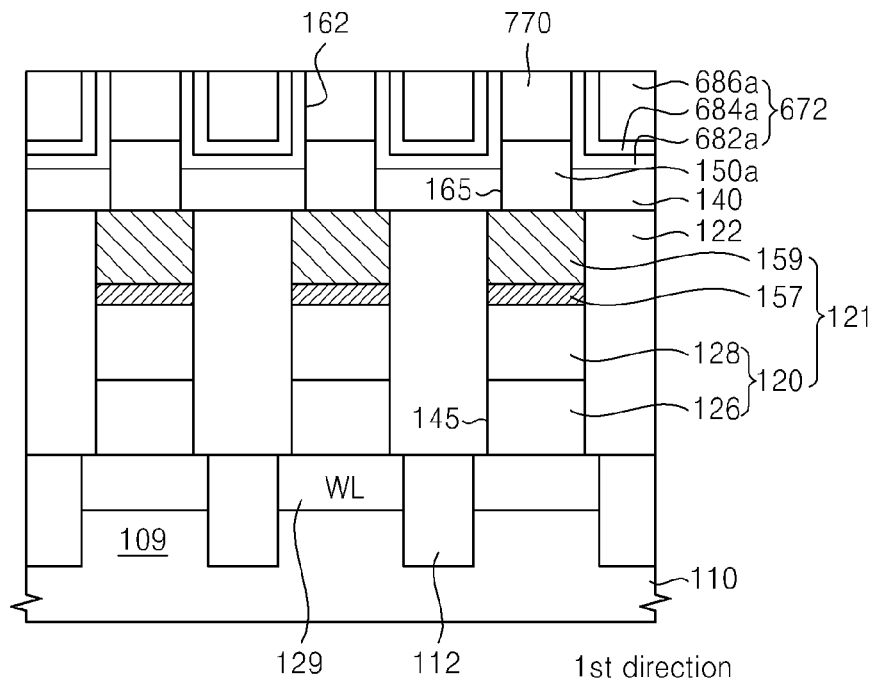

Referring to FIG. 42, a phase-change material layer may be formed on the lower electrodes 150 and the insulation layer structure 672 to fill the openings 162, and an upper portion of the phase-change material layer may be planarized until a top surface of the insulation layer structure 672 is exposed. Thus, a plurality of phase-change material layers 770 may be formed on the lower electrodes 150, respectively.

The phase-change material layers 770 having an island shape may be formed in both of the first and second directions. In example embodiments, the phase-change material layer 770 may be a rectangular pillar. The phase-change material layer 770 may be formed using chalcogenide, e.g., GeTe, SbTe, GeSbTe, GeTeAs, SnTeSn, SeTeSn, GeTeSe, SbSeBi, GeBiTe, GeTeTi, InSe, GaTeSe, InSbTe, etc. In an example embodiment, the phase-change material layer 770 may be formed using GeSbTe by a sputtering process.

Figure 43:
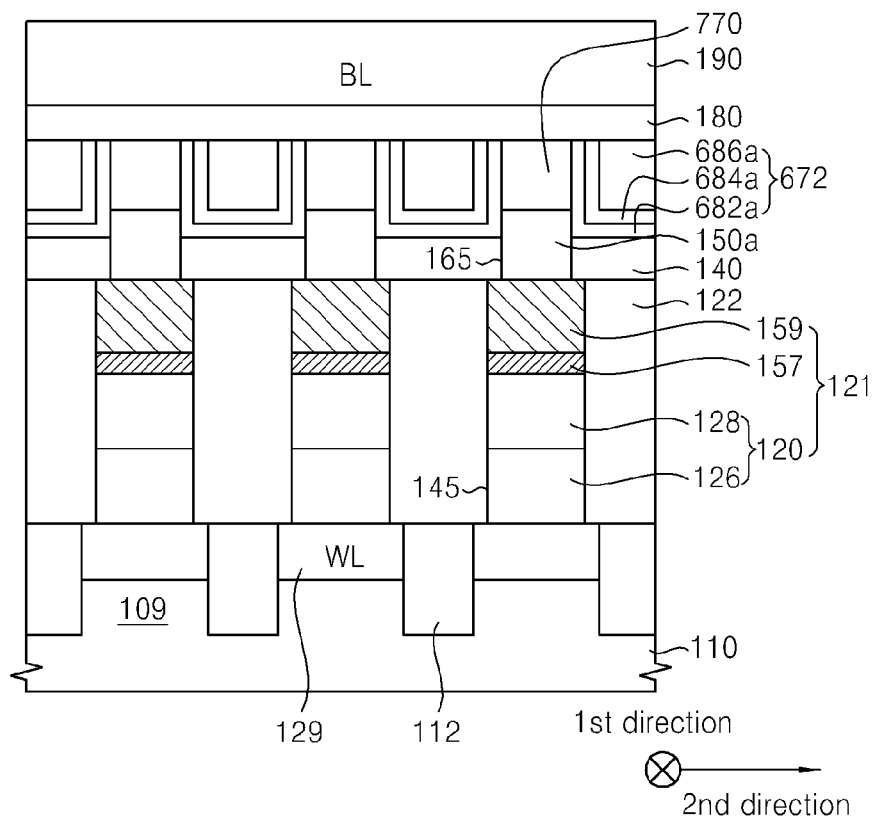

Referring to FIG. 43, a third mold layer (not shown) may be formed on the phase-change material layers 770 and the insulation layer structure 672, and partially removed to form a third mold layer pattern (not shown) having third openings (not shown) therethrough. The plurality of third openings may be formed along the first direction, and each third opening may extend in the second direction to expose the phase-change material layers 770 and portions of the insulation layer structure 672 between the phase-change material layers 770.

The third mold layer pattern may be formed using a material substantially the same as that of the first interlayer insulating layer 122. Alternatively, the third mold layer pattern may be formed using silicon nitride, silicon oxynitride, etc.

An upper electrode layer 180 and a bitline 190 filling each third opening may be formed on the phase-change material layers 770 and the insulation layer structure 672.

In example embodiments, a first metal layer may be formed in the third opening and an upper portion of the first metal layer may be removed to form the upper electrode layer 180. A second metal layer contacting the first metal layer may be formed in the remaining portion of the third opening and an upper portion thereof may be planarized to form the bitline 190.

The first metal layer may be formed using a material that is not reacted with the phase-change material layer 770. For example, the first metal layer may be formed using a metal or a metallic compound such as titanium carbide (TiC), tantalum carbide (TaC), titanium nitride (TiN), tantalum nitride (TaN), tungsten nitride (WN), titanium carbon nitride (TiCN), tantalum carbon nitride (TaCN), tungsten oxynitride (WON), titanium silicon nitride (TiSiN) or tantalum silicon nitride (TaSiN), tungsten silicon nitride (WSiN), or other similar material. For example, the second metal layer may be formed using copper, tungsten, or other similar material.

In example embodiments, before forming the second metal layer, a barrier layer (not shown) may be further formed on an inner wall of the third opening and the upper electrode layer 180. The barrier layer may be formed using titanium, tantalum, titanium nitride, tantalum nitride, titanium silicide, or other similar material.

In example embodiments, when the second metal layer is formed using copper, a seed layer (not shown) may be formed on the barrier layer, and a copper layer may be grown by an SEG process to fill the remaining portion of the third opening. Alternatively, when the second metal layer is formed using tungsten, a tungsten layer may be formed on the barrier layer to fill the remaining portion of the third opening, and an upper portion of the tungsten layer may be planarized to form the bitline 190.

As illustrated above, in the method of manufacturing the phase change memory device 700, after the insulation layer structure 672 surrounding the preliminary lower electrodes 150 is formed, the upper portion of the preliminary lower electrodes 150 may be removed to form the opening 162 and the phase-change material layer 770 may fill the opening 162. Thus, the effect of prevention of the heat transfer between adjacent cells including the phase-change material layers 770 and the lower electrode layers 150a may be enhanced, and data loss due to the heat transfer may be reduced.

Figure 55:
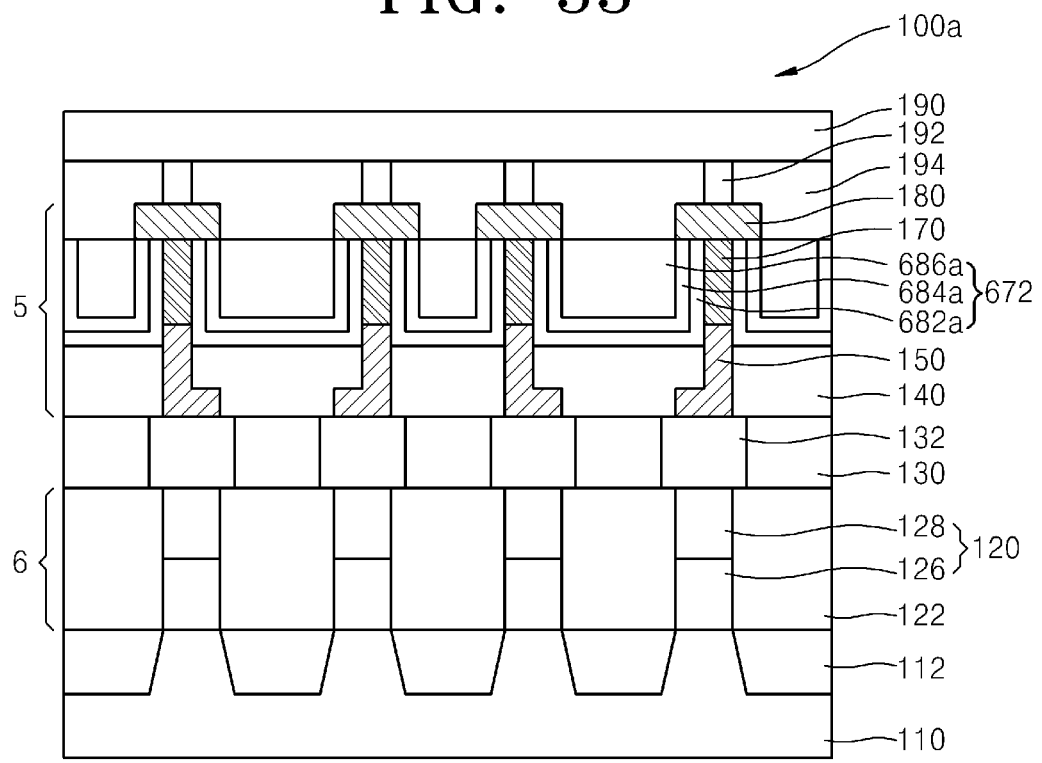
FIG. 55 is a schematic cross-sectional view of a phase change memory device according to example embodiments of inventive concepts.

As shown in FIG. 32, an insulation layer or layers may be provided on the sidewalls of the phase-change material layer 770 and at least partially on the sidewalls of the lower electrode 150 which may reduce or prevent heat transfer from the phase-change material layer 770 and/or the lower electrode 150 to the exterior thereof, thereby providing a more reliable phase change in the phase-change material layer 770 due to the heat generated by the applied current. In addition, the features of FIG. 32 may also be applied to the example embodiments shown in FIGS. 2, 22, 23, 26, and 30. FIG. 55 is a schematic cross-sectional view of a phase change memory device according to example embodiments of inventive concepts, in which the features of FIG. 32 is applied to the example embodiments shown in FIG. 2.

Figure 44:
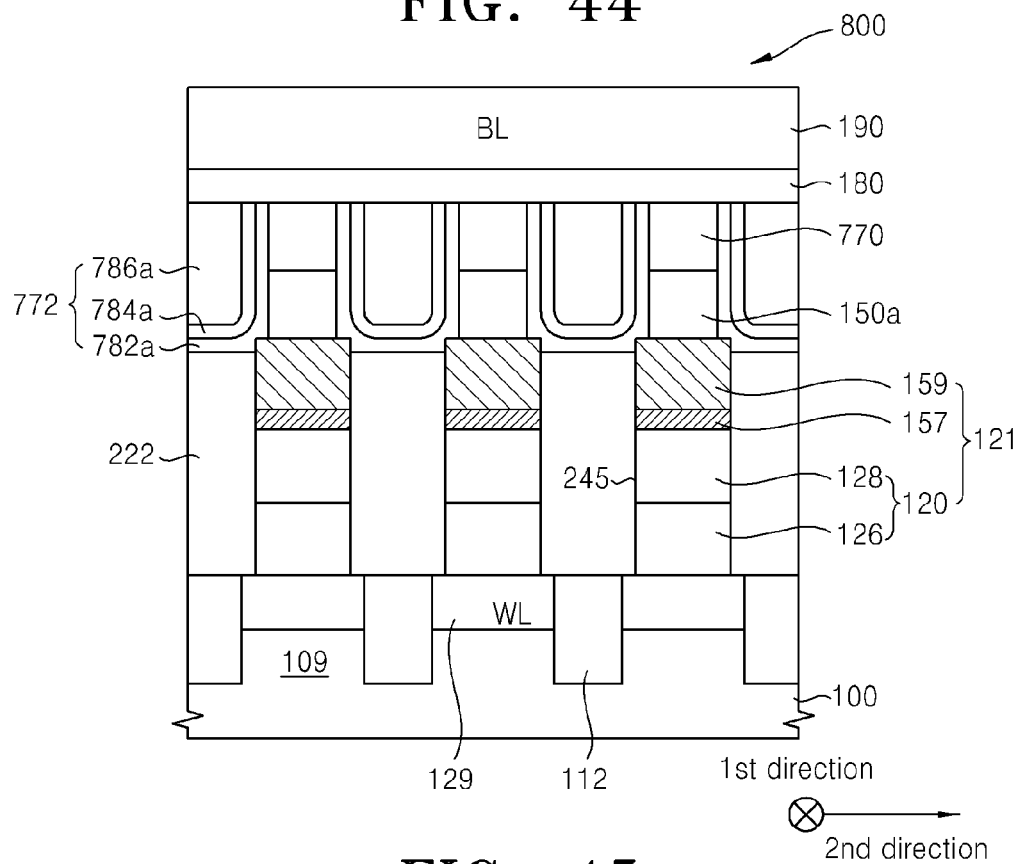
FIG. 44 is a cross-sectional view illustrating a phase change memory device in accordance with example embodiments of inventive concepts.

FIG. 44 is a cross-sectional view illustrating a phase change memory device 800 in accordance with example embodiments of inventive concepts. The phase change memory device 800 may be substantially the same as that of FIG. 32 except that the phase change memory device 800 does not have the mold insulating layer 140 and a first interlayer insulating layer 222 and an insulation layer structure 772 have different shapes from those of FIG. 32. Thus, like reference numerals refer to like elements, and repetitive explanations thereto are omitted here.

Referring to FIG. 44, the contact structure 121 may fill a first opening 245 through the first interlayer insulating layer 222 and further protrude from a top surface of the first interlayer insulating layer 222. The insulation layer structure 772 may be directly formed on the first interlayer insulating layer 222. Thus, the insulation layer structure 772 may surround not only the phase-change material layers 770 but also the lower electrode layers 150a. Additionally, the insulation layer structure 772 may surround upper portions of the contact plugs 159.

The insulation layer structure 772 may include a first thin film pattern 782a and a second thin film pattern 784a that are sequentially formed on the sidewalls of the phase-change material layers 770, the lower electrode layers 150a and the upper portions of the contact plugs 159, and further include a filling layer pattern 786a on the second thin film pattern 784a. The first and second thin film patterns 782a and 784a may have different thermal conductivities from each other, and the filling layer pattern 786a may have a top surface coplanar with that of the phase-change material layers 770.

The insulation layer structure 772 may surround not only the phase-change material layers 770 but also the lower electrode layers 150a, and thus the phase change memory device 800 of FIG. 44 may have enhanced electrical insulative characteristics compared to those of the phase change memory device 700 of FIG. 32.

In example embodiments shown in FIG. 44, the sidewalls of the phase-change material layers 770 and the lower electrode layers 150a may be aligned and the sidewalls of the contact structures 121 and the diodes 120 may be aligned, but both groups need not be aligned with each other. In example embodiments shown in FIG. 44, the phase-change material layers 770 and the lower electrode layers 150a may have the same first width and the contact structures 121 and the diodes 120 may have the same second width, but the first and second widths need not be same.

FIGS. 45 to 48 are cross-sectional views illustrating a method of manufacturing the phase change memory device 800 of FIG. 44.

First, processes substantially the same as those illustrated with reference to FIGS. 34 to 36 may be performed.

Figure 45:
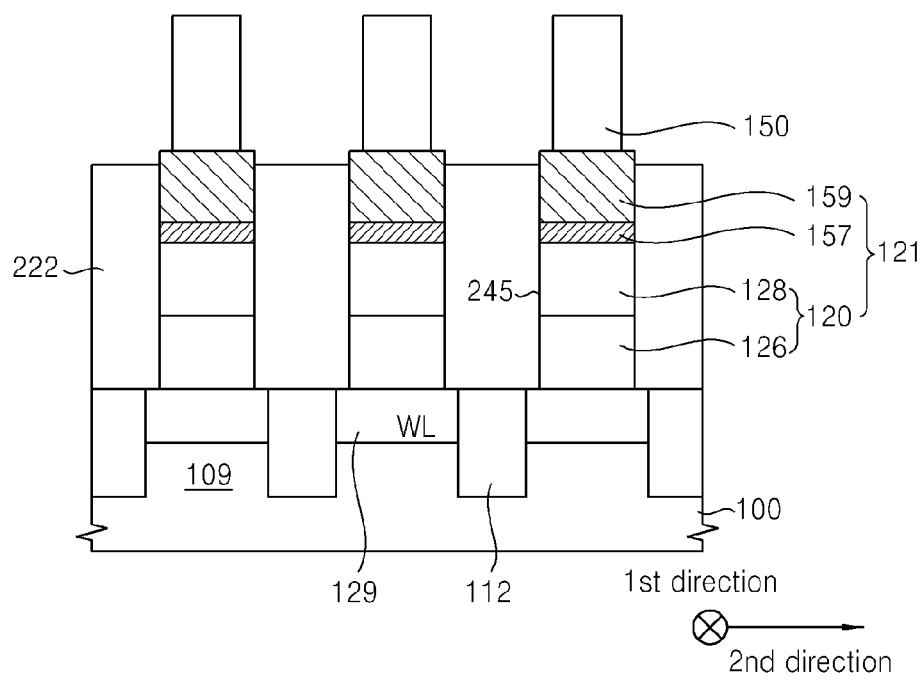
FIGS. 45 to 48 are cross-sectional views illustrating a method of manufacturing the phase change memory device of FIG. 44.

Referring to FIG. 45, the preliminary mold layer pattern 140a may be removed by a wet etching process. The wet etching process may be performed using a solution including HF, $H_3PO_4$ and deionized water. An upper portion of the first interlayer insulating layer 222 may be further removed by a wet etching process. Thus, not only sidewalls of the preliminary lower electrodes 150 but also sidewalls of upper portions of the contact plugs 159 may be exposed.

Referring to FIG. 45, the preliminary lower electrodes 150 are treated. The treatment may be an oxidation treatment or nitridation treatment and may be performed using plasma oxidation/nitridation, thermal oxidation/thermal nitridation, or ashing.

Figure 46:
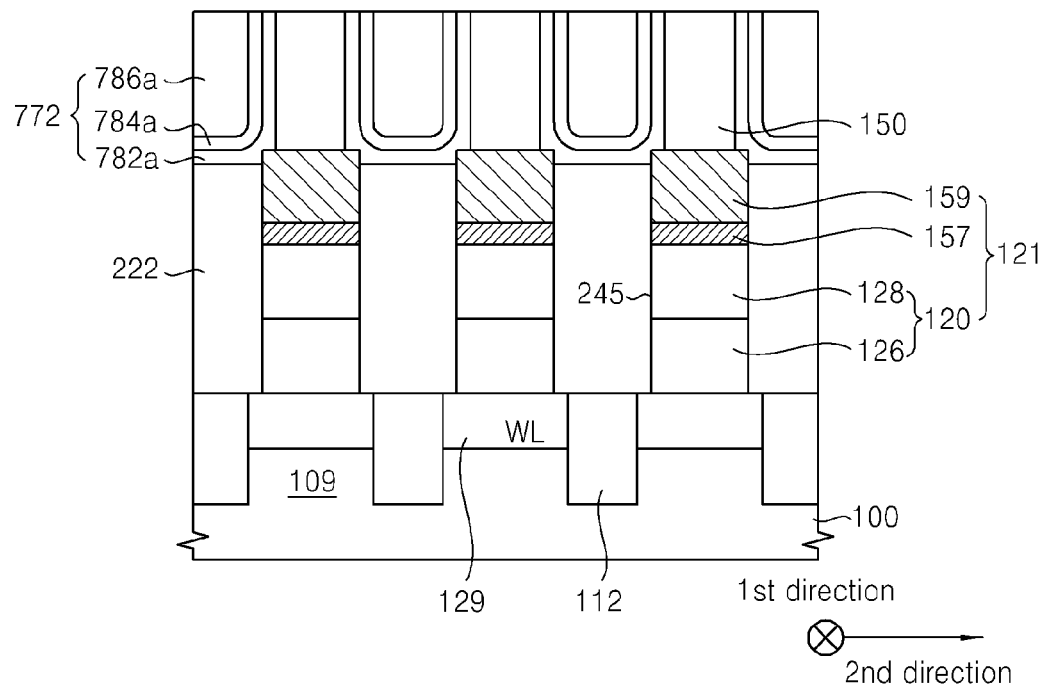

Referring to FIG. 46, a first thin film 782 and a second thin film 784 having different thermal conductivities may be sequentially and conformally formed on the sidewalls of the preliminary lower electrodes 150, the sidewalls of the upper portions of the contact plugs 159, and a top surface of the first interlayer insulating layer 222, and a filling layer 786 may be formed on the second thin film 784 to sufficiently fill the space between the preliminary lower electrodes 150.

Upper portions of the filling layer 786, the first and second thin films 782 and 784 may be planarized until a top surface of the preliminary lower electrodes 150 is exposed to form an insulation layer structure 772 including a first thin film pattern 782a, a second thin film pattern 784a and a filling layer pattern 786a sequentially stacked.

Figure 47:
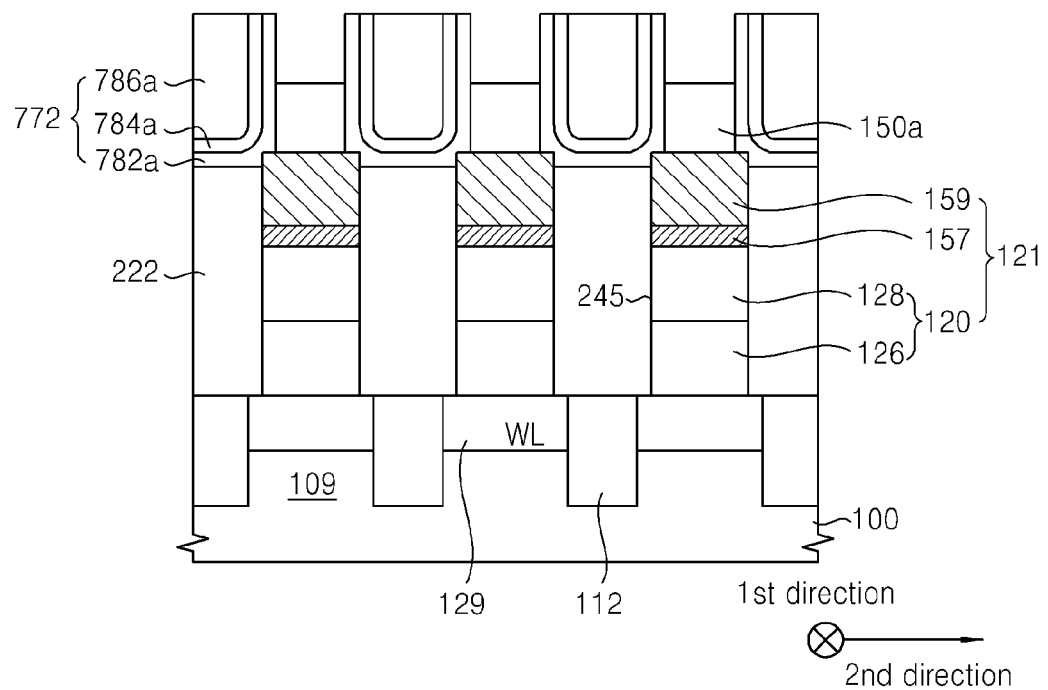

Referring to FIG. 47, upper portions of the preliminary lower electrodes 150 may be removed by a wet etching process to form a lower electrode layer 150a. The wet etching process may be performed using SC1 solution.

Figure 48:
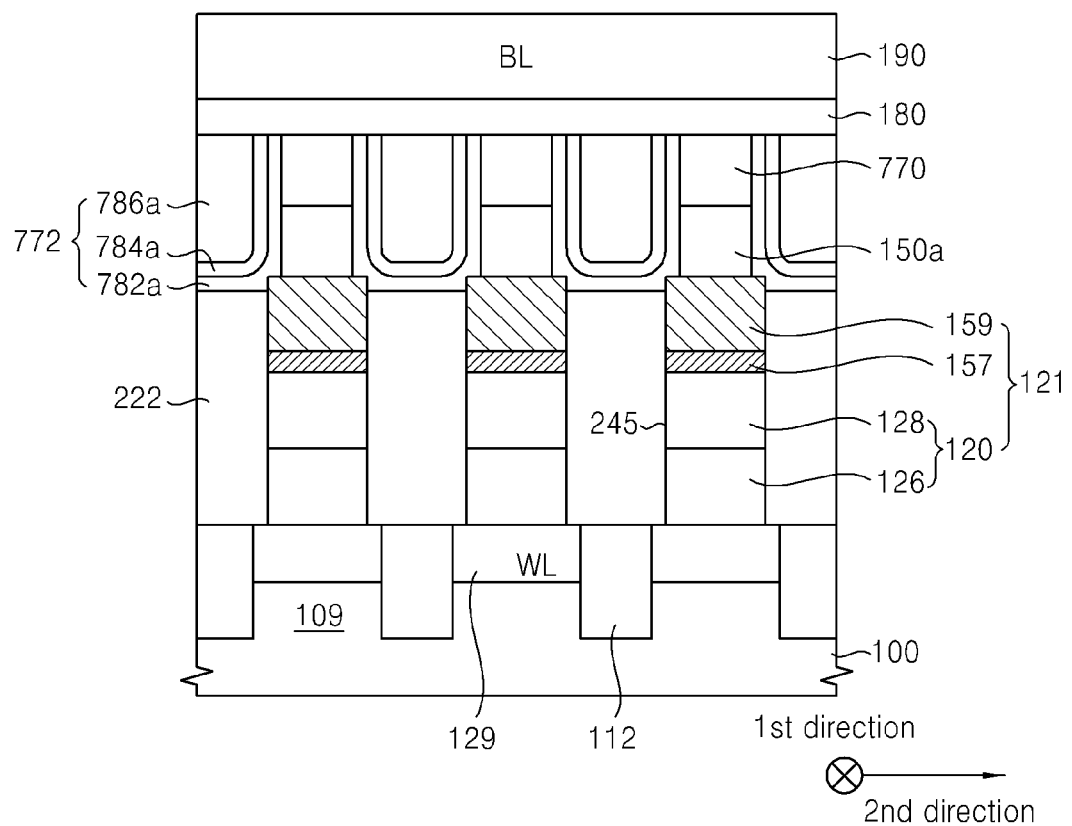

Referring to FIG. 48, a phase-change material layer may be formed on the lower electrodes 150 and the insulation layer structure 772, and an upper portion of the phase-change material layer may be planarized until a top surface of the insulation layer structure 772 is exposed. Thus, a plurality of phase-change material layers 770 may be formed on the lower electrodes 150a, respectively. Accordingly, the insulation layer structure 772 may surround the sidewalls of both of the lower electrode layers 150a and the phase-change material layers 770.

Processes substantially the same as those illustrated with reference to FIG. 43 may be performed to form the phase change memory device 800.

The insulation layer structure 772 of the phase change memory device 800 of example embodiments of inventive concepts may surround the sidewalls of both of the phase-change material layers 770 and the lower electrode layers 150a, and thus the effect of prevention of the heat transfer between adjacent cells may be enhanced.

Figure 56:
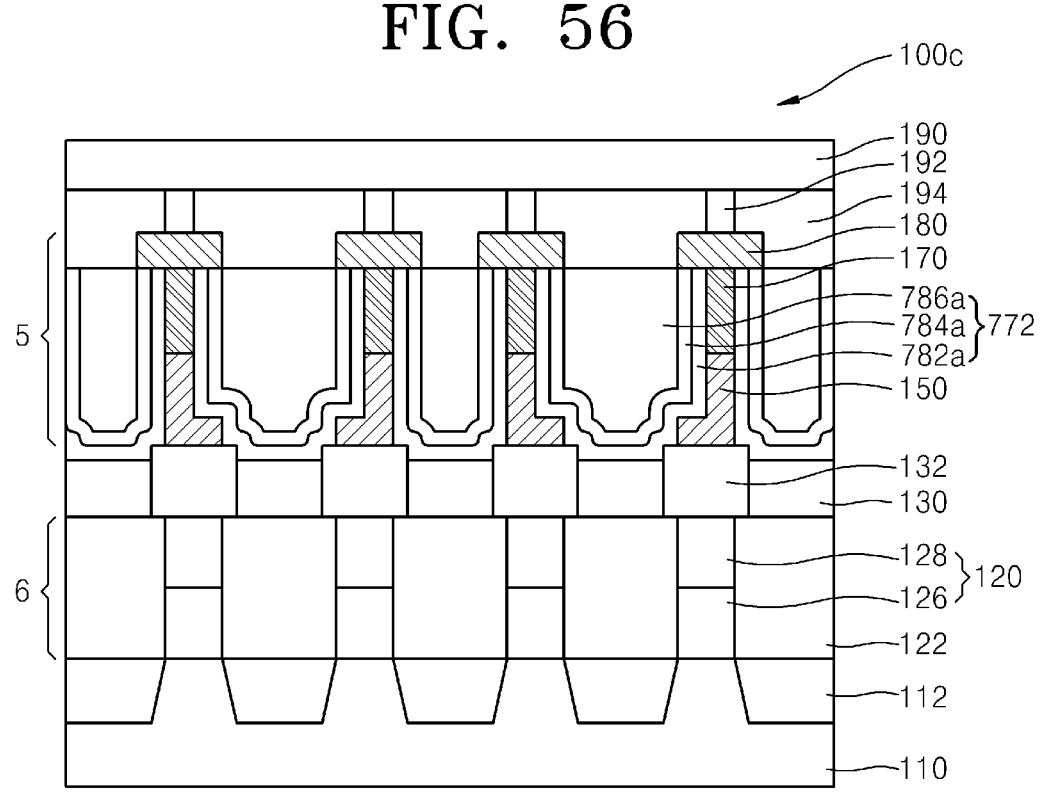
FIG. 56 is a schematic cross-sectional view of a phase change memory device according to example embodiments of inventive concepts.

As shown in FIG. 44, an insulation layer or layers may be provided on the sidewalls of the phase-change material layer 770 and on the sidewalls of the lower electrode 150a which may reduce or prevent heat transfer from the phase-change material layer 770 and/or the lower electrode 150a to the exterior thereof, thereby providing a more reliable phase change in the phase-change material layer 770 due to the heat generated by the applied current. In addition, the features of FIG. 44 may also be applied to the example embodiments shown in FIGS. 2, 22, 23, 26, and 30. FIG. 56 is a schematic cross-sectional view of a phase change memory device according to example embodiments of inventive concepts, in which the features of FIG. 44 is applied to the example embodiments shown in FIG. 2.

Figure 49:
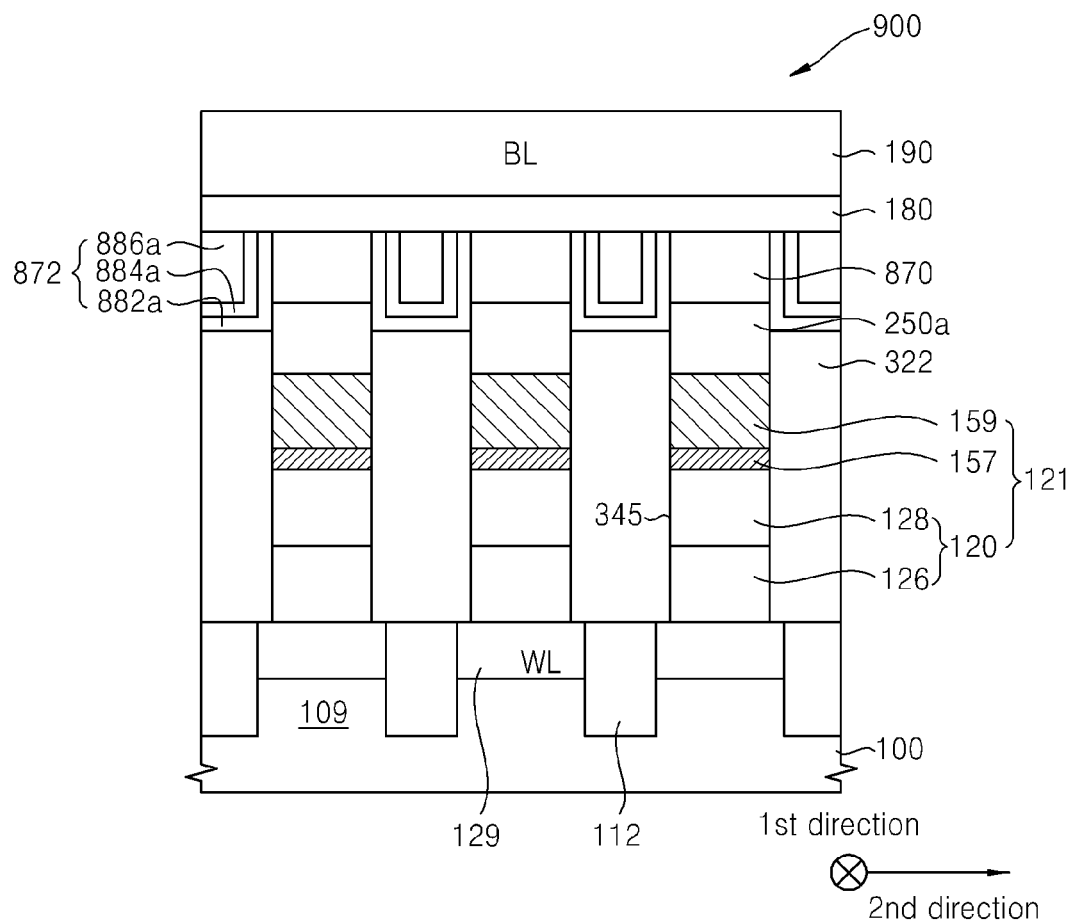
FIG. 49 is a cross-sectional view illustrating a phase change memory device in accordance with example embodiments of inventive concepts.
Figure 50:
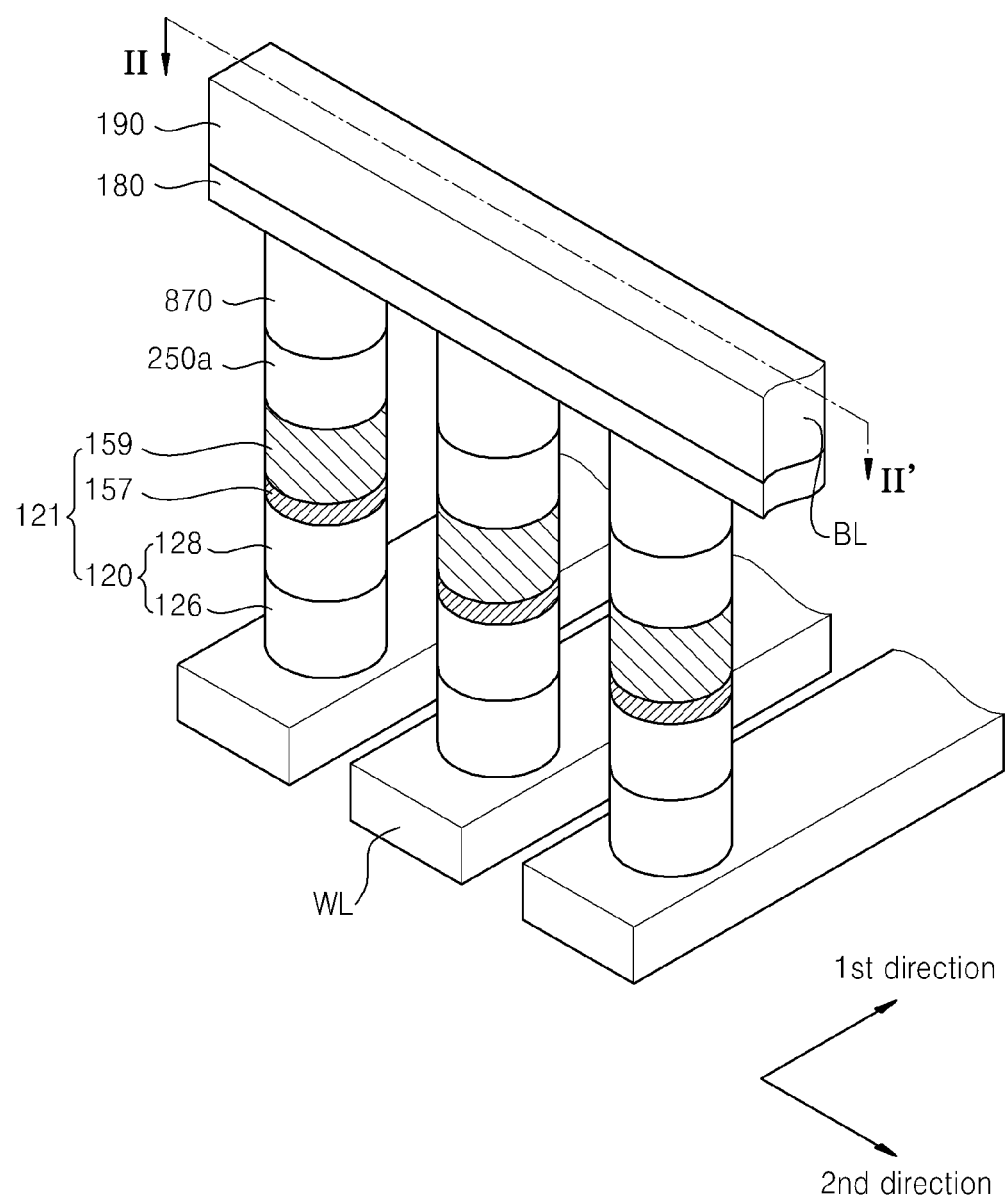
FIG. 50 is a perspective view illustrating a cell array of the phase change memory device of FIG. 49.

FIG. 49 is a cross-sectional view illustrating a phase change memory device 900 in accordance with example embodiments of inventive concepts, and FIG. 50 is a perspective view illustrating a cell array of the phase change memory device 900 of FIG. 49. FIG. 49 is a cross-sectional view cut along the line II-II' of FIG. 50.

The phase change memory device 900 may be substantially the same as that of FIG. 32 except that the phase change memory device 900 does not have the mold insulating layer 140 and a first interlayer insulating layer 322, a lower electrode layer 250a, an insulation layer structure 872 and a phase-change material layer 870 have different shapes from those of FIG. 32. Thus, like reference numerals refer to like elements, and repetitive explanations thereto are omitted here.

Referring to FIGS. 49 and 50, not only the contact structure 121 but also a lower portion of the lower electrode layer 250a may fill each first opening 345 through the first interlayer insulating layer 322. An upper portion of the lower electrode layer 250a may protrude from a top surface of the first interlayer insulating layer 322. The phase-change material layer 870 may be formed on the lower electrode layer 250a, and the insulation layer structure 872 may be formed on sidewalls of the phase-change material layers 870 and the upper portions of the lower electrode layers 250a and on the top surface of the first interlayer insulating layer 322. The insulation layer structure 872 may include a first thin film pattern 882a and a second thin film pattern 884a that are sequentially stacked, and further include a filling layer pattern 886a on the second thin film pattern 884a. The first and second thin film patterns 882a and 884a may have different thermal conductivities from each other, and the filling layer pattern 886a may have a top surface coplanar with that of the phase change material layers 870.

In example embodiments shown in FIG. 49, the sidewalls of the phase-change material layers 870, the lower electrode layers 250a, the contact structures 121, and/or the diodes 120 may be aligned. In example embodiments shown in FIG. 49, the phase-change material layers 870, the lower electrode layers 250a, the contact structures 121, and/or the diodes 120 may have the same width.

Each first opening 345 may have a circular or elliptical shape from a top view, and thus the lower electrode layer 250a and the phase-change material layer 870 in the first opening 345 may have a circular or elliptical shape from a top view.

The first interlayer insulating layer 322 may have a top surface higher that that of the contact plug 159 and lower than that of the lower electrode layer 250a, and the insulation layer structure 872 may directly contact the top surface of the first interlayer insulating layer 322.

Figure 51:
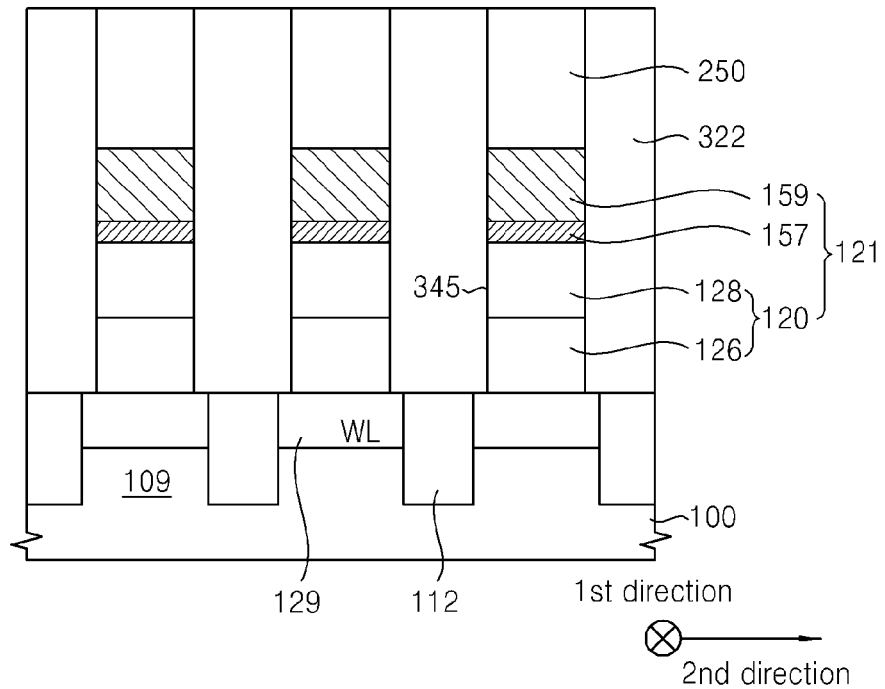
FIGS. 51 to 53 are cross-sectional views illustrating a method of manufacturing the phase change memory device of FIG. 49.
Figure 52:
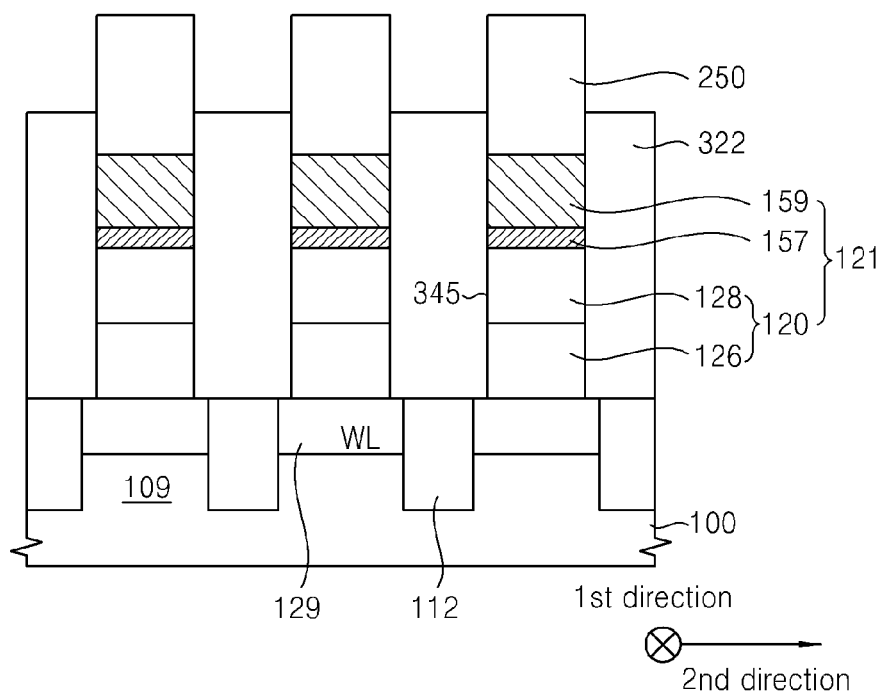
Figure 53:
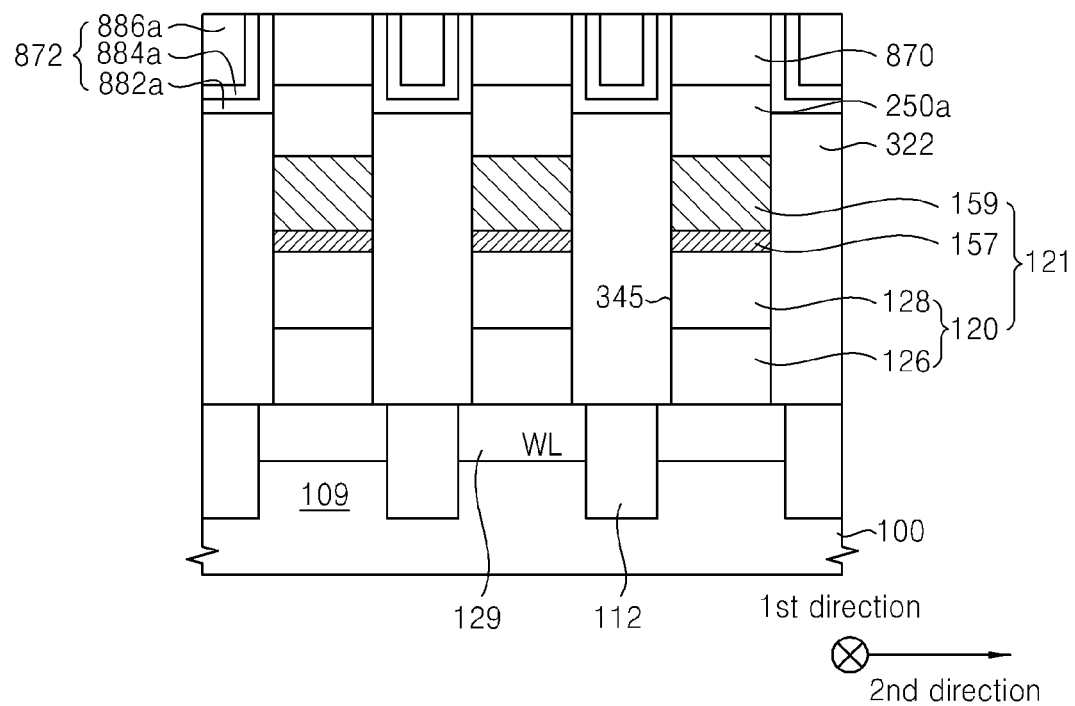
Figure 54:
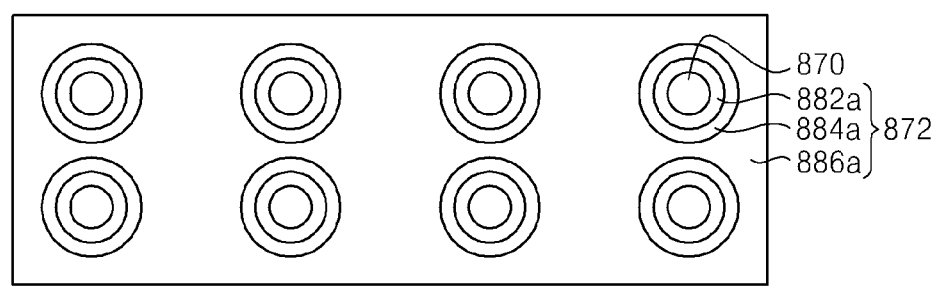
FIG. 54 is a plan view of the phase change memory device of FIG. 53.

FIGS. 51 to 53 are cross-sectional views illustrating a method of manufacturing the phase change memory device 900 of FIG. 50 and FIG. 54 is a plan view of the phase change memory device 900 of FIG. 53.

Referring to FIG. 51, a first interlayer insulating layer 322 having a plurality of first openings 345 exposing the word lines 129 may be formed. The first interlayer insulating layer 322 may be formed to have a thickness in consideration of the total thickness of the diode 120, the ohmic contact layer 157, the contact plug 159 and a lower electrode layer 250a. Each first opening 345 may have a circular or elliptical shape from a top view.

A contact structure 121 may be formed in a lower portion of each first opening 345 by sequentially forming the diode 120, the ohmic contact layer 157 and the contact plug 159 on each word line 129. A preliminary lower electrode 250 may be formed on the contact structure 121 to fill the remaining portion of the first opening 345.

Referring to FIG. 52, an upper portion of the first interlayer insulating layer 322 may be removed by a wet etching process. The wet etching process may be performed using a solution including HF, $H_3PO_4$ and deionized water.

Referring to FIG. 52, the preliminary lower electrodes 250 are treated. The treatment may be an oxidation treatment or nitridation treatment and may be performed using plasma oxidation/nitridation, thermal oxidation/thermal nitridation, or ashing.

Referring to FIGS. 53 and 54, a first thin film 882 and a second thin film 884 having different thermal conductivities may be sequentially and conformally formed on the sidewalls of the preliminary lower electrodes 250 and a top surface of the first interlayer insulating layer 322, and a filling layer 886 may be formed on the second thin film 884 to sufficiently fill the space between the preliminary lower electrodes 250.

Upper portions of the filling layer 886, the first and second thin films 882 and 884 may be planarized until a top surface of the preliminary lower electrodes 250 is exposed to form an insulation layer structure 872 including a first thin film pattern 882a, a second thin film pattern 884a and a filling layer pattern 886a sequentially stacked.

Processes substantially the same as those illustrated with reference to FIGS. 41 to 43 may be performed so that the preliminary lower electrode 250 may be transformed into a lower electrode layer 250a, and a phase-change material layer 870 may be formed on each lower electrode 250a. Thus, the insulation layer structure 872 may surround sidewalls of the phase-change material layers 870 and upper portions of the lower electrodes layers 250a.

A plurality of upper electrode layer 180 and bitlines 190 may be formed on the phase-change material layers 870 and the insulation layer structure 872 to complete the phase change memory device 900.

In the method of manufacturing the phase change memory device 900 of FIG. 50, a second mold layer pattern may not be formed. Additionally, the phase-change material layer 870 and the lower electrode layer 250a may have a circular or elliptical shape.

According to example embodiments, an insulation layer structure may be formed on phase change material patterns and lower electrodes, and thus the heat transfer between adjacent cells in a phase change memory device may be prevented. Thus, data loss due to the heat interference may be reduced.

As shown in FIG. 49, an insulation layer or layers may be provided on the sidewalls of the phase-change material layer 870 and at least partially on the sidewalls of the preliminary lower electrode 250 which may reduce or prevent heat transfer from the phase-change material layer 870 and/or the preliminary lower electrode 250 to the exterior thereof, thereby providing a more reliable phase change in the phase-change material layer 870 due to the heat generated by the applied current. In addition, the features of FIG. 49 may also be applied to the example embodiments shown in FIGS. 2, 22, 23, 26, and 30.

FIG. 55 is a schematic cross-sectional view of a phase change memory device according to example embodiments of inventive concepts, in which the features of FIG. 32 is applied to the example embodiments shown in FIG. 2.

Referring to FIG. 55, the phase change memory device 100 may be substantially the same as that of FIG. 2 except that the phase change memory device 100 has the insulation layer structures 672 surrounding the phase-change material layers 770 and upper portions of the lower electrode layer 150. Thus, like reference numerals refer to like elements, and repetitive explanations thereto are omitted here.

FIG. 55 is a schematic cross-sectional view of a phase change memory device according to example embodiments of inventive concepts, in which the features of FIG. 32 is applied to the example embodiments shown in FIG. 2.

Referring to FIG. 56, the phase change memory device 100 may be substantially the same as that of FIG. 2 except that the phase change memory device 100 has the insulation layer structures 772 surrounding the phase-change material layers 770 and upper portions of the lower electrode layer 150 and upper portions of the contact plugs 132. Thus, like reference numerals refer to like elements, and repetitive explanations thereto are omitted here.

Figure 57:
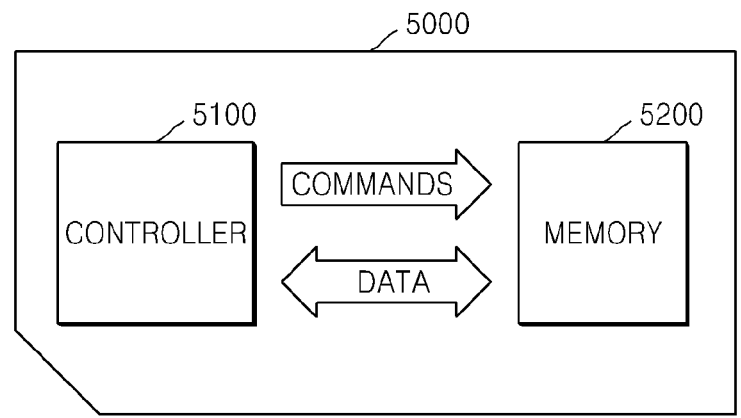
FIG. 57 is a schematic view illustrating a memory card according to example embodiments of inventive concepts.

FIG. 57 is a schematic view illustrating a memory card 5000 according to example embodiments of inventive concepts.

Referring to FIG. 57, the memory card 5000 may includes a controller 5100 and a memory 5200. The controller 5100 and the memory 5200 are disposed to send/receive electric signals to/from each other. For example, when the controller 5100 gives a command to the memory 5200, the memory 5200 can send data. The memory 5200 can include the phase change memory devices according to various example embodiments of inventive concepts. The phase change memory device according to the various example embodiments of inventive concepts can be disposed in architecture arrays in correspondence to the logic gate design. The memory arrays disposed in a plurality of rows and columns can have one or more memory array bank (not shown). The memory 5200 can include the memory array (not shown) or the memory array bank (not shown). The memory card 5000 can further include conventional members, such as a conventional row decoder (not shown), a column decoder (not shown), input/output (I/O) buffers (now shown), and/or a control resistor (not shown) in order to drive the memory array bank (not shown), all of which are known in the art. The memory card 5000 can be used in memory devices as a memory card, for example, such as a memory stick card, a smart media (SM) card, a secure digital (SD) card, a mini SD card, or a multi media card (MMC).

Figure 58:
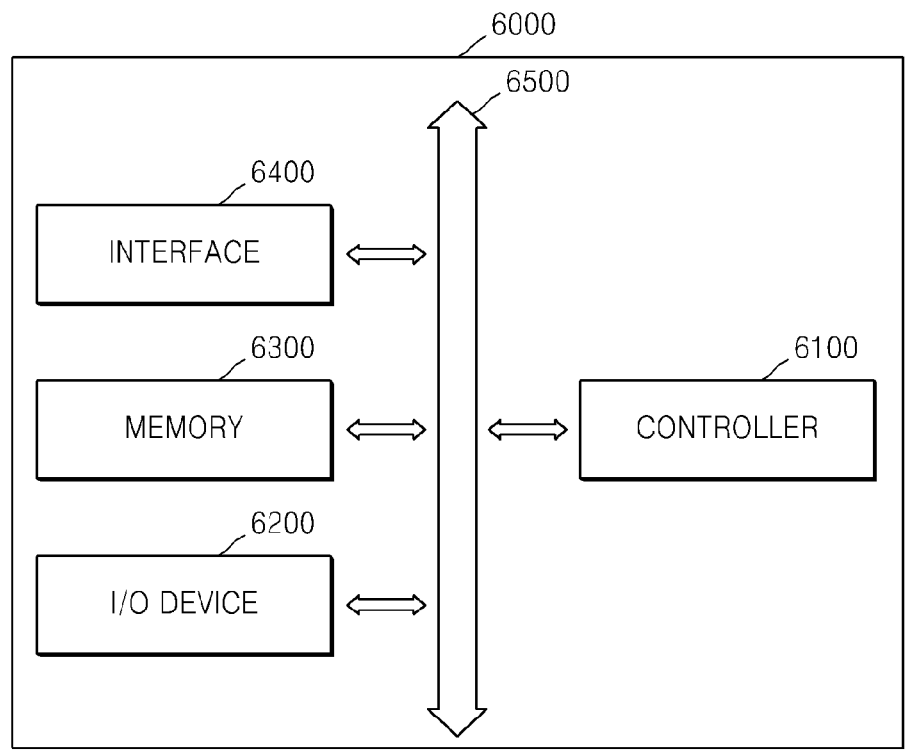
FIG. 58 is a schematic diagram of a system according to example embodiments of inventive concepts.

FIG. 58 is a schematic diagram of a system 6000 according to example embodiments of inventive concepts.

Referring to FIG. 58, the system 6000 may include a controller 6100, an input/output device 6200, a memory 6300, and an interface 6400. The system 6000 may be a mobile system or a system that transmits or receives data. The mobile system may be a personal digital assistant (PDA), a portable computer, a web tablet, a wireless phone, a mobile phone, a digital music player, or a memory card. The controller 6100 executes a software program and controls the system 6000. The controller 6100 may be a microprocessor, a digital signal processor, a microcontroller, or similar device. The input/output device 6200 can be used to input or output data of the system 6000. The system 6000 is connected to an external apparatus, for example, a personal computer or a network, using the input/output device 6200, to send/receive data to/from the external apparatus. The input/output device 6200 may be a keypad, a keyboard, or a display. The memory 6300 may store codes and/or data for operating the controller 6100 and/or may store data processed by the controller 6100. The memory 6300 may include phase change memory devices according to various example embodiments of inventive concepts. The interface 6400 may be a data transmission path between the system 6000 and an external apparatus. The controller 6100, the input/output device 6200, the memory 6300, and the interface 6400 may communicate with one another by a bus 6500. For example, the system 6000 can be used for a mobile phone, a MP3 player, a navigation system, a portable multimedia player (PMP), a solid state disk (SSD), or a household appliance.

Figure 59:
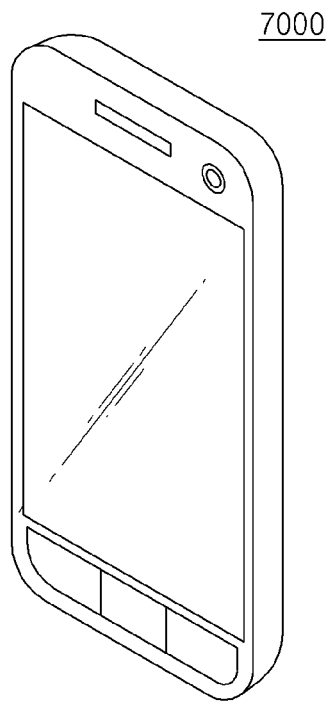
FIG. 59 is a perspective view of an electronic device in which a semiconductor device manufactured according to example embodiments of inventive concepts may be used.

FIG. 59 is a perspective view of an electronic device 7000 in which a semiconductor device manufactured according to example embodiments of inventive concepts can be used.

Referring to FIG. 59, electronic systems (5000 of FIG. 57 and 6000 of FIG. 58) are used in an electronic device 7000, e.g., a mobile phone. The electronic systems (5000 of FIG. 57 and 6000 of FIG. 58) may also be used for a portable laptop computer, a MP3 player, a navigation system, a solid state disc (SSD), a car, or a household appliance.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A method of forming a memory device, comprising:
   forming a plurality of preliminary electrodes, each of the plurality of preliminary electrodes including a protruding region, protruding from a first mold insulating layer;
   forming a second mold insulating layer on the first mold insulating layer;
   removing at least a portion of the plurality of preliminary electrodes to form a plurality of openings in the second mold insulating layer and a plurality of lower electrodes; and
   forming a plurality of memory elements in the plurality of openings.

2. The method of claim 1, wherein the memory elements are variable resistance memory elements.

3. The method of claim 1, wherein the memory elements are phase change memory elements.

4. The method of claim 1, wherein the plurality of preliminary electrodes are made of at least one selected from the group consisting of titanium (Ti), tantalum (Ta), molybdenum (Mo), hafnium (Hf), zirconium (Zr), chrome (Cr), tungsten (W), niobium (Nb), and vanadium (V).

5. The method of claim 1, wherein the plurality of preliminary electrodes 151 are made of a combination of at least one selected from the group consisting of titanium (Ti), tantalum (Ta), molybdenum (Mo), hafnium (Hf), zirconium (Zr), chrome (Cr), tungsten (W), niobium (Nb), and vanadium (V) and at least one selected from the group consisting of nitrogen (N), carbon (C), aluminum (Al), boron (B), phosphor (P), oxygen (O), and silicon (Si).

6. The method of claim 1, wherein the plurality of preliminary electrodes are made of at least one selected from the group consisting of TiN, TiW, TiCN, TiAlN, TiSiC, TiSiN, TaN, TaW, TaCN, TaAlN, TaSiC, TaSiN, MoN, MoW, MoCN, MoAlN, MoSiC, and MoSiN.

7. The method of claim 1, further comprising:
   treating each of the plurality of protruding regions to form a plurality of sacrificial regions and the plurality of lower electrodes.

8. The method of claim 7, wherein the treating includes at least one of oxidation or nitridation.

9. The method of claim 7, wherein an entirety of the plurality of sacrificial regions are removed.

10. The method of claim 1, further comprising:
forming a plurality of thin films on the plurality of protruding regions.

11. The method of claim 7, further comprising:
isotropically etching the plurality of sacrificial regions;
removing the plurality of isotropically etched sacrificial regions to form the plurality of openings.

12. The method of claim 11, further comprising:
forming a plurality of thin films on the plurality of isotropically etched sacrificial regions.

13. The method of claim 12, wherein the plurality of thin films are formed on an entirety of sidewalls of the plurality of sacrificial regions and a portion of sidewalls of the plurality of lower electrodes.

14. The method of claim 12, wherein the plurality of thin films are formed on a portion of sidewalls of the plurality of sacrificial regions.

15. The method of claim 12, wherein the plurality of thin films are formed on an entirety of sidewalls of the plurality of sacrificial regions and the plurality of lower electrodes.

16. The method of claim 7, further comprising:
forming a plurality of thin films on the plurality of sacrificial regions.

17. The method of claim 16, wherein the plurality of thin films are formed on an entirety of sidewalls of the plurality of sacrificial regions and a portion of sidewalls of the plurality of lower electrodes.

18. The method of claim 16, wherein the plurality of thin films are formed on a portion of sidewalls of the plurality of sacrificial regions.

19. The method of claim 16, wherein the plurality of thin films are formed on an entirety of sidewalls of the plurality of sacrificial regions and the plurality of lower electrodes.

20. The method of claim 1, wherein a width of the plurality of memory elements is less than a width of the plurality of lower electrodes.

21. The method of claim 1, wherein a width of the plurality of memory elements is greater than a width of the plurality of lower electrodes.

22. The method of claim 1, wherein a width of the plurality of memory elements is equal to a width of the plurality of lower electrodes.

23. The method of claim 7, wherein a lowermost portion of the plurality of sacrificial regions is partially removed.

24. The method of claim 23, further comprising:
forming a plurality of thin films on the plurality of sacrificial regions.

25. The method of claim 24, wherein the plurality of thin films are formed on an entirety of sidewalls of the plurality of sacrificial regions and a portion of sidewalls of the plurality of lower electrodes.

26. The method of claim 23, further comprising:
isotropically etching the plurality of sacrificial regions.

27. The method of claim 24, further comprising:
forming the plurality of thin films on the plurality of isotropically etched sacrificial regions.

28. The method of claim 27, wherein the plurality of thin films are formed on an entirety of sidewalls of the plurality of sacrificial regions and a portion of sidewalls of the plurality of lower electrodes.

29. The method of claim 24, wherein the plurality of thin films are formed on a portion of sidewalls of the plurality of sacrificial regions.

30. The method of claim 24, wherein the plurality of thin films are formed on an entirety of sidewalls of the plurality of sacrificial regions and the plurality of lower electrodes.

31. The method of claim 27, wherein the plurality of thin films are formed on a portion of sidewalls of the plurality of sacrificial regions.

32. The method of claim 27, wherein the plurality of thin films are formed on an entirety of sidewalls of the plurality of sacrificial regions and the plurality of lower electrodes.

* * * * *